(12) United States Patent  
Choi et al.

(10) Patent No.: US 12,080,796 B2
(45) Date of Patent: Sep. 3, 2024

(54) SEMICONDUCTOR DEVICE

(71) Applicant: SAMSUNG ELECTRONICS CO., LTD., Suwon-si (KR)

(72) Inventors: Kyung In Choi, Seoul (KR); Hae Jun Yu, Osan-si (KR); Sung Hun Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 385 days.

(21) Appl. No.: 17/462,026

(22) Filed: Aug. 31, 2021

(65) Prior Publication Data

US 2022/0302310 A1 Sep. 22, 2022

(30) Foreign Application Priority Data

Mar. 18, 2021 (KR) .................. 10-2021-0035128

(51) Int. Cl.
*H01L 29/78* (2006.01)
*H01L 23/528* (2006.01)
*H01L 29/08* (2006.01)

(52) U.S. Cl.
CPC ...... *H01L 29/7851* (2013.01); *H01L 23/5283* (2013.01); *H01L 29/0847* (2013.01)

(58) Field of Classification Search
None
See application file for complete search history.

(56) References Cited

U.S. PATENT DOCUMENTS

| | | | |
|---|---|---|---|
| 9,312,182 B2 | 4/2016 | Xie et al. | |
| 9,312,354 B2 | 4/2016 | Liu et al. | |
| 9,455,254 B2 | 9/2016 | Xie et al. | |
| 9,653,356 B2 | 5/2017 | Park et al. | |
| 10,276,674 B2 | 4/2019 | Schroeder | |
| 10,388,770 B1 | 8/2019 | Xie et al. | |
| 10,546,854 B2 | 1/2020 | Xie et al. | |
| 2019/0148226 A1* | 5/2019 | Yim | H01L 29/6656 257/383 |
| 2020/0035549 A1 | 1/2020 | Wu | |
| 2021/0335783 A1* | 10/2021 | Chiu | H01L 21/7682 |
| 2022/0085179 A1* | 3/2022 | Kim | H01L 29/775 |

* cited by examiner

*Primary Examiner* — Cory W Eskridge
(74) *Attorney, Agent, or Firm* — Fish & Richardson P.C.

(57) ABSTRACT

A semiconductor device includes; an active pattern on a substrate, gate structures in which each gate structure includes a gate electrode intersecting the active pattern and a gate capping pattern on the gate electrode, a source/drain pattern disposed on the active pattern between adjacent gate structures, a lower active contact connected to the source/drain pattern, an etching stop film extending along an upper surface of the lower active contact without contacting an upper surface of the gate capping pattern, and an upper active contact connected to the lower active contact, wherein a bottom surface of the upper active contact is lower than the upper surface of the gate capping pattern.

20 Claims, 30 Drawing Sheets

SEMICONDUCTOR DEVICE

CROSS-REFERENCE TO RELATED APPLICATION

This application claims priority under 35 U.S.C. 119 from Korean Patent Application No. 10-2021-0035128 filed on Mar. 18, 2021 in the Korean Intellectual Property Office, the subject matter of which is hereby incorporated by reference.

BACKGROUND

1. Field of the Disclosure

The inventive concept relates generally to semiconductor devices.

2. Description of the Related Art

As one approach to scaling (e.g., increasing the integration density of) semiconductor devices, a multi gate transistor including a multi-channel active pattern (or a silicon body) having a fin or nanowire shape may be formed on a substrate, and a gate may be formed on a surface of the multi-channel active pattern.

Since this type of multi-gate transistor has a three-dimensional (3D) channel, scaling may be readily accomplished. Further, even if a gate length of the multi-gate transistor is not increased, an overall current control capability may be improved. Furthermore, a short channel effect (SCE) in which the potential of a channel region is influenced by a drain voltage may be effectively suppressed.

However, as the pitch (e.g., the inter-component separation distance(s)) of semiconductor devices decreases, additional research and development directed to securing lower capacitance and improved electrical stability between contacts is required.

SUMMARY

Embodiments of the inventive concept provide semiconductor devices providing improved element/component performance, as well as improved overall reliability.

In one aspect, the inventive concept provides a semiconductor device including; an active pattern extending in a first direction on a substrate, gate structures extending in a second direction on the active pattern, wherein each gate structure includes a gate electrode intersecting the active pattern and a gate capping pattern on the gate electrode, a source/drain pattern disposed on the active pattern between adjacent gate structures, a lower active contact connected to the source/drain pattern, an etching stop film extending along an upper surface of the lower active contact without contacting an upper surface of the gate capping pattern, and an upper active contact connected to the lower active contact, wherein a bottom surface of the upper active contact is lower than the upper surface of the gate capping pattern.

In one aspect, the inventive concept provides a semiconductor device including; an active pattern extending in a first direction on a substrate, gate structures disposed on the active pattern and extending in a second direction intersecting the first direction, wherein each gate structure includes a gate electrode intersecting the active pattern and a gate capping pattern on the gate electrode, a source/drain pattern disposed on the active pattern between the gate structures, an interlayer insulating film disposed on the source/drain pattern, wherein an upper surface of the interlayer insulating film is at a same plane as an upper surface of the gate capping pattern, a lower active contact disposed in the interlayer insulating film and connecting the source/drain pattern, wherein an upper surface of the lower active contact is lower than the upper surface of the interlayer insulating film, an etching stop film extending along the upper surface of the lower active contact, and an upper active contact disposed within the interlayer insulating film and penetrating the etching stop film to contact the lower active contact, wherein the etching stop film does not extend to the upper surface of the interlayer insulating film.

In one aspect, the inventive concept provides a semiconductor device including; an active pattern extending in a first direction on a substrate, gate structures disposed on the active pattern and extending in a second direction intersecting the first direction, wherein each of the gate structures includes a gate electrode intersecting the active pattern, and a gate capping pattern, a source/drain pattern disposed on the active pattern between the gate structures, an interlayer insulating film disposed on the source/drain pattern, wherein an upper surface of the interlayer insulating film is at a same plane as an upper surface of the gate capping pattern, a lower active contact disposed within the interlayer insulating film and connected to the source/drain pattern, wherein an upper surface of the lower active contact is lower than the upper surface of the interlayer insulating film, an etching stop film disposed within the interlayer insulating film and extending along the upper surface of the lower active contact, an upper active contact disposed within the interlayer insulating film and penetrating the etching stop film to contact the lower active contact, a wiring etching stop film extending along the upper surface of the gate capping pattern, the upper surface of the interlayer insulating film, and an upper surface of the upper active contact, and a wiring pattern formed on the upper active contact to penetrate the wiring etching stop film, wherein a bottom surface of the upper active contact is lower than the upper surface of the gate capping pattern, the etching stop film does not extend to the upper surface of the interlayer insulating film, and the etching stop film does not extend to the upper surface of the gate capping pattern.

BRIEF DESCRIPTION OF THE DRAWINGS

The above and other aspects and features of the inventive concept will become more apparent upon consideration of the following detailed description together with the accompanying drawings, in which.

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Although certain semiconductor devices according to embodiments of the inventive concept described herein are fin-type transistor(s) (e.g., a Fin-type Field-Effect-Transistors or FinFETs) including a channel region with a fin-type pattern shape are illustrated and described herein, those skilled in the art will appreciate—following a review of the subject specification—that the scope of the inventive concept is not limited to only fin-type transistors. Rather, other embodiments of the inventive concept may provide transistor(s) including: a nanowire or a nanosheet, so-called Multi-Bridge Channel Field Effect Transistors (MBCFET™), tunneling transistor(s) (e.g., tunneling FETs) and similar three-dimensional (3D) transistors. Still other embodiments of the inventive concept provide planar transistors (e.g., transistors formed by two-dimensional (2D) materials, as well as a heterostructure thereof. Still other semiconductor devices consistent with embodiments of the inventive concept provide bipolar junction transistors, laterally diffused metal oxide semiconductors (LDMOSs), etc.

Figure 1:
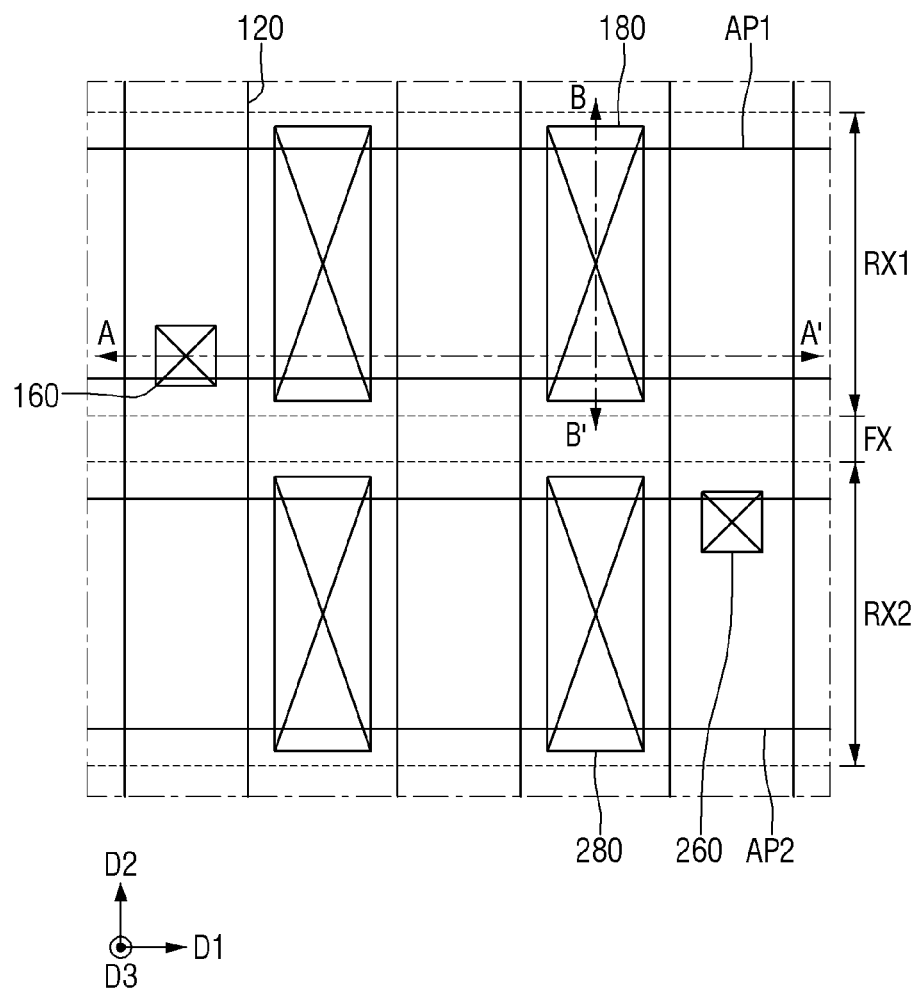
FIG. 1 is a plan (top-down, or layout) diagram illustrating a semiconductor device according to embodiments of the inventive concept.
Figure 2:
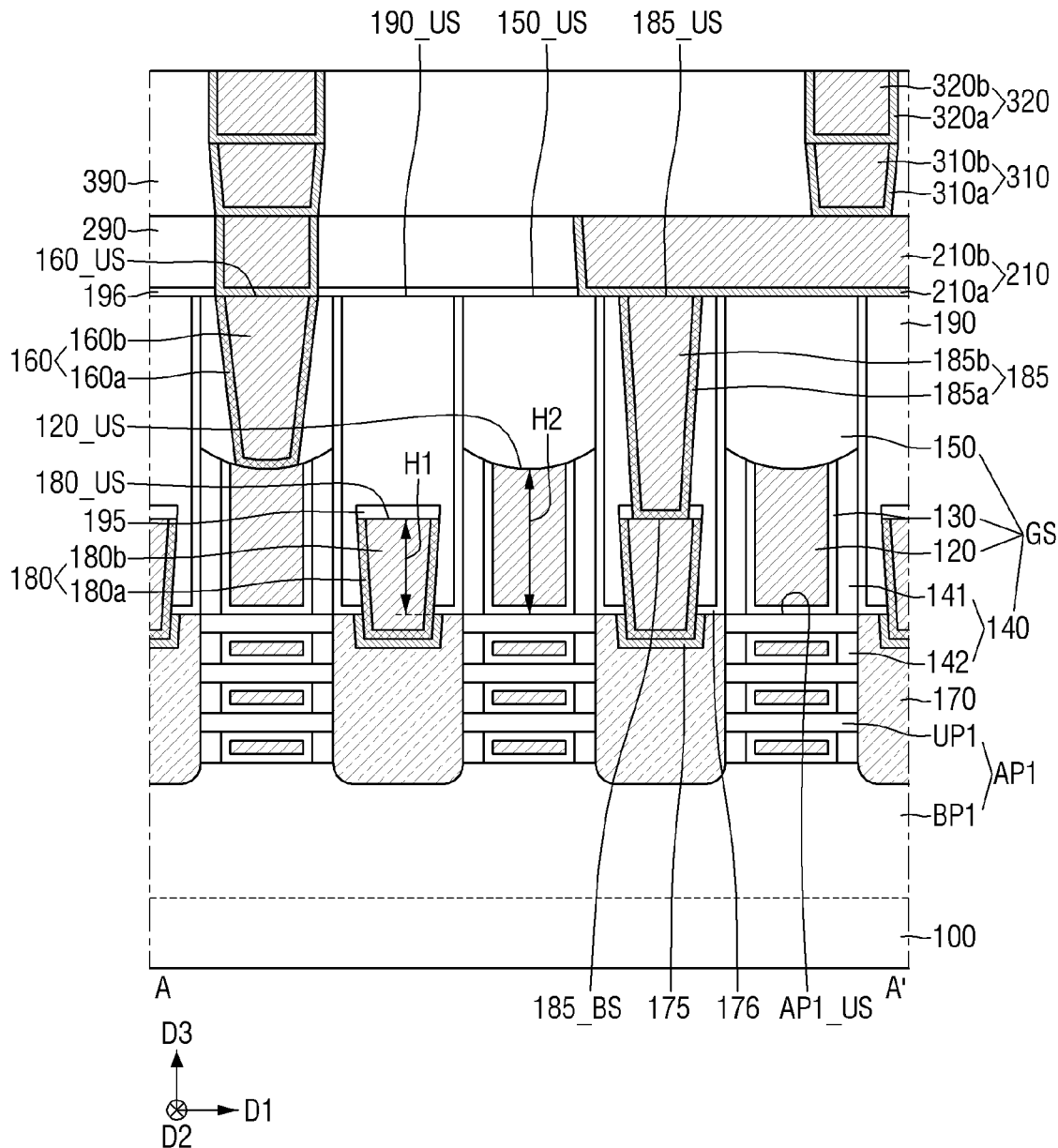
FIG. 2 is a cross-sectional diagram taken along A-A' of FIG. 1, and FIGS. 3A and 3B are cross-sectional diagram taken along B-B' of FIG. 1.
Figure 3A:
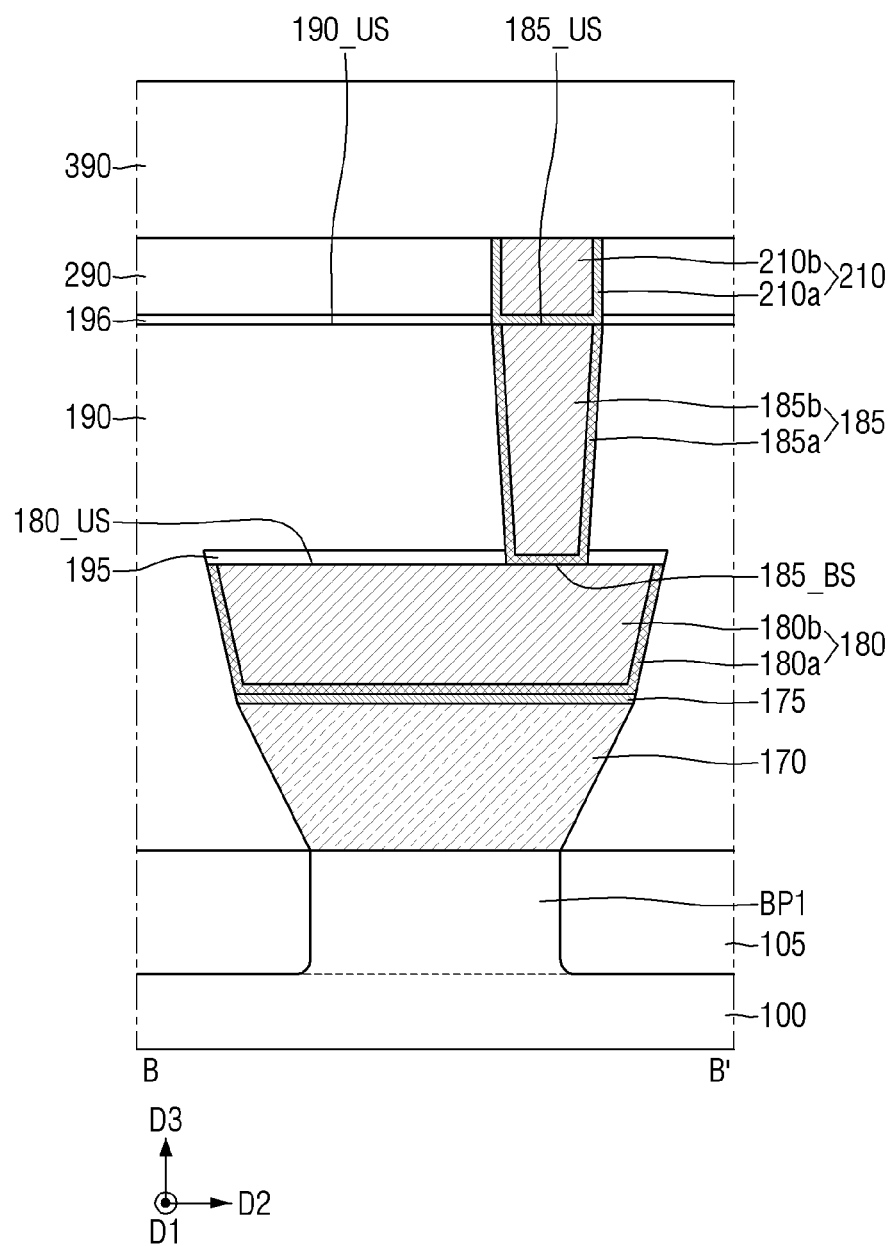
Figure 3B:
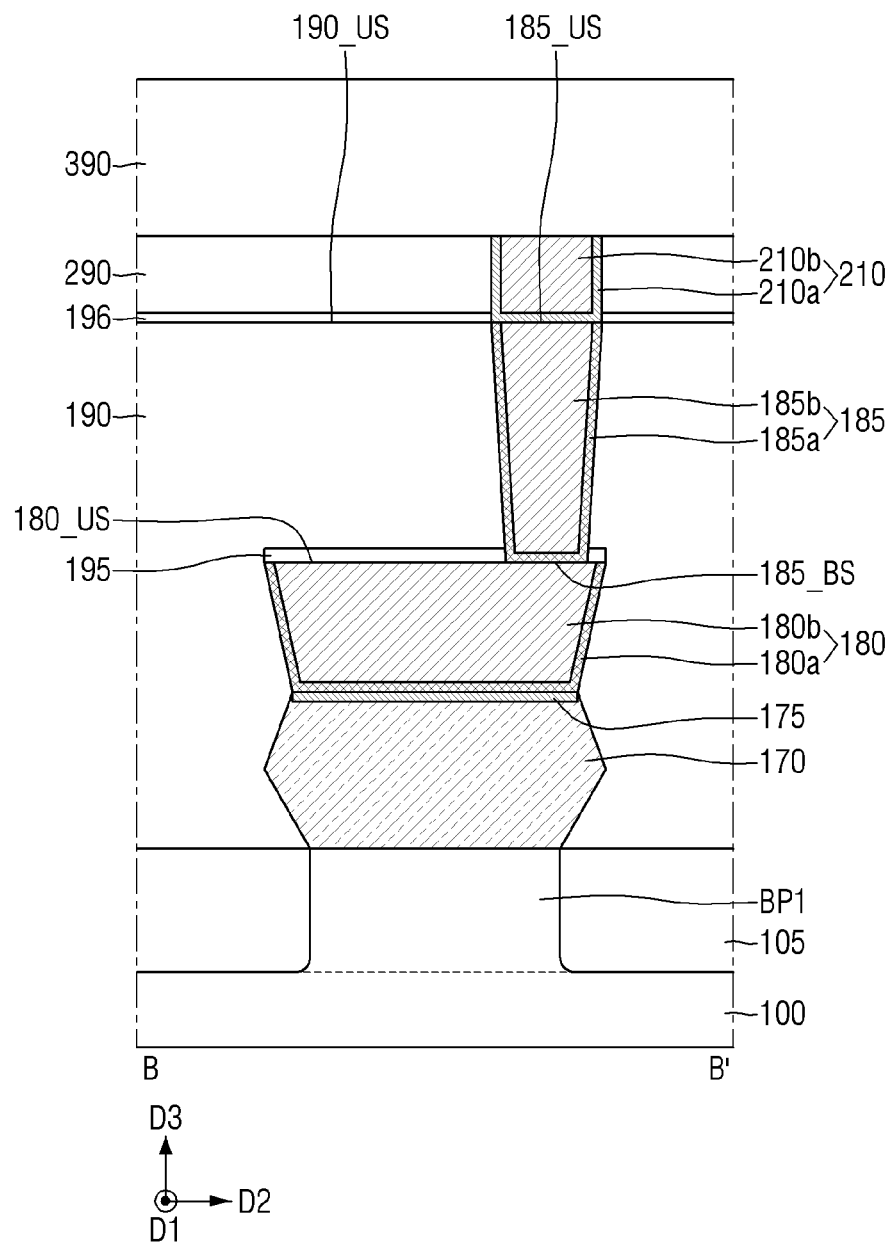

FIG. 1 is a plan (top-down or layout) diagram illustrating a semiconductor device according to embodiments of the inventive concept, FIG. 2 is a cross-sectional diagram taken along A-A' of FIG. 1, and FIGS. 3A and 3B are cross-sectional diagrams taken along B-B' of FIG. 1.

Referring collectively to FIGS. 1, 2, 3A and 3B, a semiconductor device according to embodiments of the inventive concept may include one or more first active patterns AP1, one or more second active patterns AP2, a gate electrode 120, a first active contact 180, a second active contact 280, and a gate contact 160.

That is, a substrate 100 may include a first active region RX1, a second active region RX2, and a field region FX. The field region FX may be formed immediately adjacent to the first active region RX1 and the second active region RX2. The field region FX may form a boundary between the first active region RX1 and the second active region RX2.

The first active region RX1 and the second active region RX2 are spaced apart, and in some embodiments, the first active region RX1 and the second active region RX2 may be separated by the field region FX. Further, an element isolation film may be disposed around the combination of the first active region RX1 and the second active region RX2. That is, a portion of the element isolation film located between the first active region RX1 and the second active region RX2 may be the field region FX. For example, a portion of a channel region in which a transistor is formed may be the active region, and a portion dividing the channel region may be the field region. Alternately, the active region may be a portion in which a fin-type pattern or nanosheet used as the channel region of the transistor is formed, and the field region may be a region in which the fin-type pattern or nanosheet used as the channel region is not formed.

In some embodiments, one of the first active region RX1 or the second active region RX2 may be a P-type Metal Oxide Semiconductor (PMOS) formation region, and the other thereof may be an N-type MOS (NMOS) formation region. In another embodiment, the first active region RX1 and the second active region RX2 may be the PMOS formation region. In still another embodiment, the first active region RX1 and the second active region RX2 may be the NMOS formation region.

The substrate 100 may be a silicon substrate or an SOI (silicon-on-insulator). In contrast, the substrate 100 may include, but is not limited to, silicon germanium, SGOI (silicon germanium on insulator), indium antimonide, lead tellurium compounds, indium arsenic, indium phosphide, gallium arsenide or gallium antimonide.

One or more first active patterns AP1 may be formed in the first active region RX1. The first active pattern AP1 may protrude from the substrate 100 of the first active region RX1. The first active pattern AP1 may extend long along a first direction D1 on the substrate 100. For example, the first active pattern AP1 may include a long side extending in the first direction D1, and a short side extending in a second direction D2. Here, the first direction D1 may intersect the second direction D2 and a third direction D3, and the second direction D2 may intersect the third direction D3.

One or more second active patterns AP2 may be formed on the second active region RX2. Here, the second active pattern AP2 may be substantially similar to the first active pattern AP1.

The first active pattern AP1 and the second active pattern AP2 may each be a multi-channel active pattern. In some embodiments, each of the first active pattern AP1 and the second active pattern AP2 may be, for example, a sheet pattern.

The first active pattern AP1 may include a lower pattern BP1 and a sheet pattern UP1. The sheet pattern UP1 may include a plurality of sheet patterns stacked in the third direction D3. Although the three sheet patterns UP1 are shown, this is only for convenience of explanation, and the scope of the inventive concept is not limited thereto.

The sheet pattern UP1 may be connected to a source/drain pattern 170, and the sheet pattern UP1 may be a channel pattern used as a channel region of the transistor. For example, the sheet pattern UP1 may be a nanosheet or nanowire.

Although each of the single first active pattern AP1 and the single second active pattern AP2 is shown, this is only for convenience of explanation, and the scope of the inventive concept is not limited thereto. Each of the one or more first active patterns AP1 and the one or more second active patterns AP2 may be provided.

Each of the first active pattern AP1 and the second active pattern AP2 may be part of the substrate 100, and may include an epitaxial layer that is grown from the substrate 100. The first active pattern AP1 and the second active pattern AP2 may include, for example, silicon or germanium, which is an elemental semiconductor material. Further, the first active pattern AP1 and the second active pattern AP2 may include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge) and tin (Sn), or a compound obtained by doping these elements with a group IV element.

The group III-V compound semiconductor may be, for example, one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

In some embodiments, the first active pattern AP1 and the second active pattern AP2 may include the same material. In other embodiments, the first active pattern AP1 and the second active pattern AP2 may include different materials from each other.

The field insulating film 105 may be formed on the substrate 100. The field insulating film 105 may be formed over the first active region RX1, the second active region RX2, and the field region FX.

The field insulating film 105 may be formed on part of the side wall of the first active pattern AP1 and part of the side wall of the second active pattern AP2. The field insulating film 105 may be formed on part of the side wall of the lower pattern BP1. The first active pattern AP1 and the second active pattern AP2 may each protrude upward from the upper surface of the field insulating film 105. The field insulating film 105 may include, for example, an oxide film, a nitride film, an oxynitride film or a combination film thereof.

Gate structures GS may be disposed on the substrate 100. At least one or more gate structures GS may extend in the second direction D2. The plurality of gate structures GS may be disposed on the filed insulating film 105. Each of the gate structures GS may be spaced apart in the first direction D1.

The gate structure GS may be disposed on the first active pattern AP1 and the second active pattern AP2. The gate structure GS may intersect the first active pattern AP1 and the second active pattern AP2.

Although the gate structure GS is shown as being disposed over the first active region RX1 and the second active region RX2, this is only for convenience of explanation, and the embodiment is not limited thereto. That is, part of the gate structure GS may be divided by a gate separation structure disposed on the field insulating film 105, and may be disposed on the first active region RX1 and the second active region RX2.

The gate structure GS may include, for example, a gate electrode 120, a gate insulating film 130, a gate spacer 140, and a gate capping pattern 150

The gate electrode 120 may be formed on the first active pattern AP1 and the second active pattern AP2. The gate electrode 120 may intersect the first active pattern AP1 and the second active pattern AP2. The gate electrode 120 may wrap the first active pattern AP1 and the second active pattern AP2 protruding from the upper surface of the field insulating film 105. The gate electrode 120 may include a long side extending in the second direction D2 and a short side extending in the first direction D1.

An upper surface 120_US of the gate electrode may be, but is not limited to, a concave curved surface that is recessed toward the upper surface of the first active pattern AP1. That is, unlike the shown configuration, the upper surface 120_US of the gate electrode may be a flat surface.

The gate electrode 120 may include at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn) and vanadium (V).

The gate electrode 120 may include conductive metal oxides, conductive metal oxynitrides, as well as oxidized forms of the aforementioned materials.

The gate spacer 140 may be disposed on the side wall of the gate electrode 120 and extend in the second direction D2. The gate spacer 140 may include an outer spacer 141 and an inner spacer 142. The outer spacer 141 may be disposed on a sheet pattern UP1. The inner spacer 142 may be disposed between the lower pattern BP1 and the sheet pattern UP1, and between the adjacent sheet patterns UP1.

The gate spacer 140 may include at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN) and silicon oxycarbide (SiOC).

The gate insulating film 130 may extend along a side wall and a bottom surface of the gate electrode 120. The gate insulating film 130 may be formed on the first active pattern AP1 and the second active pattern AP2. The gate insulating film 130 may be formed between the gate electrode 120 and the gate spacer 140. In some embodiments, the gate insulating film 130 may wrap around the sheet pattern UP1.

The gate insulating film 130 may include at least one of silicon oxide, silicon oxynitride, silicon nitride, and a high-dielectric material having a dielectric constant higher than silicon oxide. The high-dielectric material may include at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

Some embodiments of the inventive concept may include an Negative Capacitance (NC) FET including a so-called negative capacitor. For example, the gate insulating film 130 may include a ferroelectric material film having ferroelectric properties and/or a paraelectric material film having paraelectric properties. Here, the ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. Alternately, if at least one of the capacitances of two or more capacitors connected in series has a negative value, the overall capacitances may be greater than an absolute value of each of the individual capacitances and have a positive value.

When the ferroelectric material film having the negative capacitance and the paraelectric material film having the positive capacitance are connected in series, the overall capacitance values of the series-connected ferroelectric material film and the paraelectric material film may increase. Due to this increased overall capacitance, a transistor including the ferroelectric material film may have a sub-threshold swing (SS) below 60 mV/decade at room temperature.

The ferroelectric material film having ferroelectric properties may include at least one of hafnium oxide, hafnium zirconium oxide, barium strontium titanium oxide, barium titanium oxide and lead zirconium titanium oxide. Here, in one example, the hafnium zirconium oxide may be a material obtained by doping hafnium oxide with zirconium (Zr). In another example, the hafnium zirconium oxide may be a compound including hafnium (Hf), zirconium (Zr) and oxygen (O). The ferroelectric material film may further include a doped material (or dopant). For example, the doped material may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). Thus, the type and amount of dopant included in the ferroelectric material film will vary in relation to the specific type of ferroelectric material(s) included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. That is, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film having paraelectric properties may include at least one of silicon oxide and/or a metal oxide having a high-dielectric constant. For example, the metal oxide included in the paraelectric material film may include at least one of hafnium oxide, zirconium oxide and aluminum oxide.

In some embodiments, the ferroelectric material film and the paraelectric material film may include one or more of the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

Here, the thickness of the ferroelectric material film may define, at least in part, the ferroelectric properties. For example, a thickness of the ferroelectric material film may range from 0.5 to 10 nm. Since a critical thickness exhibiting desired ferroelectric properties may vary according to specific ferroelectric material, the thickness of the ferroelectric material film may vary with choice of ferroelectric material (s).

In some embodiments, the gate insulating film 130 may include one ferroelectric material film. In some embodiments, the gate insulating film 130 may include multiple, spaced apart ferroelectric material films. That is, the gate insulating film 130 may have a stacked film structure including an alternately-stacked arrangement of ferroelectric material films and paraelectric material films.

The gate capping pattern 150 may be disposed on the upper surface 120_US of the gate electrode and the upper surface of the gate spacer 140. The gate capping pattern 150 may include at least one of silicon nitride (SiN), silicon oxynitride (SiON), silicon oxide (SiO$_2$), silicon carbonitride (SiCN) and silicon oxycarbonitride (SiOCN).

Alternately, the gate capping pattern 150 may be disposed between the gate spacers 140. In such a case, an upper surface 150_US of the gate capping pattern 150 may be disposed at the same plane as the upper surface of the gate spacer 140. The upper surface 150_US of the gate capping pattern may be an upper surface of the gate structure GS.

The gate contact 160 may be disposed inside the gate structure GS. The gate contact 160 may be connected to the gate electrode 120 included in the gate structure GS. The gate contact 160 may be formed to penetrate the gate capping pattern 150 in the third direction D3.

The gate contact 160 may be disposed to overlap, at least in part, the gate structure GS. In some embodiments, at least part of the gate contact 160 may overlap the first active pattern AP1. The upper surface 160_US of the gate contact 160 may be located at the same plane as the upper surface 150_US of the gate capping pattern 150.

In some embodiments, at least part of the gate contact 160 may overlap at least one of the first active region RX1 and the second active region RX2. For example, the gate contact 160 may be disposed entirely on the first active region RX1 and the second active region RX2.

The gate contact 160 may include multiple films (of multi-films). The gate contact 160 may include a gate contact barrier film 160a and a gate contact filling film 160b. The gate contact filling film 160b may be disposed on the gate contact barrier film 160a. The gate contact barrier film 160a may be disposed along the side walls and bottom surface of the gate contact filling film 160b.

The gate contact barrier film 160a may include at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), as well as other two-dimensional (2D) material(s). In some embodiments, the two-dimensional material may be a metallic material and/or a semiconductor material. The 2D material may include a 2D allotrope or a 2D compound such as, for example, graphene, molybdenum disulfide (MoS$_2$), molybdenum diselenide (MoSe$_2$), tungsten diselenide (WSe$_2$), and tungsten disulfide (WS$_2$).

The gate contact filling film 160b may include at least one of aluminum (Al), tungsten (W), cobalt (Co), ruthenium (Ru), silver (Ag), gold (Au), manganese (Mn), and molybdenum (Mo).

A source/drain pattern 170 may be formed on the first active pattern AP1. The source/drain pattern 170 may be formed on the lower pattern BP1. The source/drain pattern 170 may be located on the substrate 100. The source/drain pattern 170 may be disposed on the side surface of the gate structure GS. The source/drain pattern 170 may be disposed between adjacent gate structures GS.

For example, the source/drain pattern 170 may be disposed on either side of the gate structure GS. Unlike the shown configuration, the source/drain pattern 170 may be disposed on one side of the gate structure GS and may not be disposed on the other side of the gate structure GS. The upper surface of the source/drain pattern 170 may be a flat surface. However, the technical idea of the inventive concept is not limited thereto.

As shown in FIG. 3A, the source/drain pattern 170 may include a portion having a "width" (e.g., measured in the second direction D2) that increases from the upper surface of the substrate 100 toward the lower active contact 180.

That is, the width of the source/drain pattern 170 increases from the upper surface of the substrate 100 towards the lower active contact 180.

However, as shown in FIG. 3B, the source/drain pattern 170 may include a first portion having an increasing width and a second portion having a decreasing width on the first portion as the source/drain pattern 170 extends from the upper surface of the substrate 100 toward the lower active contact 180.

In some embodiments, the source/drain pattern 170 may include an epitaxial pattern. That is, the source/drain pattern 170 may be included in a source/drain region of a transistor that uses the first active pattern AP1 as a channel region.

Alternately or additionally, a source/drain pattern like the on described above may be disposed on the second active pattern AP2 between the gate structures GS.

A protective film 176 may be disposed on the upper surface of the field insulating film 105, the side wall of the gate structure GS, the upper surface of the source/drain pattern 170, and the side wall of the source/drain pattern 170. The protective film 176 may include a material having an etching selectivity with respect to a first interlayer insulating film 190. The protective film 176 may include at least one of silicon nitride (SiN), silicon oxynitride (SiON), silicon oxycarbonitride (SiOCN), silicon boronitride (SiBN), silicon oxyboronitride (SiOBN) and silicon oxycarbide (SiOC).

The first interlayer insulating film 190 may be formed on the field insulating film 105. The first interlayer insulating film 190 may be disposed on the source/drain pattern 170. The first interlayer insulating film 190 may not cover the upper surface 150_US of the gate capping pattern 150. For example, the upper surface 190_US of the first interlayer insulating film 190 may be disposed at the same plane as the upper surface 150_US of the gate capping pattern 150.

The first interlayer insulating film 190 may not cover the upper surface 160_US of the gate contact 160. For example, the upper surface 190_US of the first interlayer insulating film 190 may be disposed at the same plane as the upper surface 160_US of the gate contact 160.

The first interlayer insulating film 190 may not cover an upper surface 185_US of the upper active contact 185. The upper surface 190_US of the first interlayer insulating film 190 may be located at the same plane as the upper surface 185_US of the upper active contact 185.

The first interlayer insulating film 190 may include at least one of Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels and mesoporous silica.

The first active contacts 180 and 185 may be disposed on the first active region RX1. The second active contact 280 may be disposed on the second active region RX2.

The first active contacts 180 and 185 may be connected to the source/drain pattern 170 formed in the first active region RX1. Alternately or additionally, the second active contact 280 may be connected to a source/drain region formed in the second active region RX2. Of additional note, the second active contact 280 may be substantially the same as the first active contacts 180 and 185 described hereafter.

The first active contacts 180 and 185 may include a lower active contact 180 and an upper active contact 185.

The lower active contact 180 may be connected to the source/drain pattern 170. The lower active contact 180 may be disposed on the source/drain pattern 170. The lower active contact 180 may be disposed within (or inside) the first interlayer insulating film 190. The lower active contact 180 may be surrounded by the first interlayer insulating film 190. In this regard, for example, the lower active contact 180 may not contact at least one of the gate structures GS disposed on both sides.

In some embodiments, an upper surface 180_US of the lower active contact 180 may be "lower than" the upper surface 150_US of the gate capping pattern 150—assuming the upper surface of the substrate 100 as a reference. The upper surface 180_US of the lower active contact 180 may be lower than the upper surface 190_US of the first interlayer insulating film 190—assuming the upper surface of the substrate 100 as a reference. The upper surface 180_US of the lower active contact 180 may be lower than the upper surface 160_US of the gate contact 160—assuming the upper surface of the substrate 100 as a reference.

In some embodiments, the upper surface 180_US of the lower active contact 180 may be lower than the upper surface 120_US of the gate electrode 120—assuming the upper surface of the substrate 100 as a reference. That is, a first "height" (e.g., measured in the third direction) H1 from the upper surface AP1_US of the first active pattern AP1 to the upper surface 180_US of the lower active contact 180 may be less than a second height H2 from the upper surface AP1_US of the first active pattern AP1 to the upper surface 120_US of the gate electrode 120.

A silicide film 175 may be formed between the lower active contact 180 and the source/drain pattern 170. Although the silicide film 175 is shown as being formed along a profile of an interface between the source/drain pattern 170 and the lower active contact 180, the scope of the inventive concept is not limited thereto. The silicide film 175 may include, for example, a metal silicide material.

The lower active contact 180 may be formed of multifilms. The lower active contact 180 may include, for example, a lower active contact barrier film 180a and a lower active contact filling film 180b. The lower active contact filling film 180b may be disposed on the lower active contact barrier film 180a. The lower active contact barrier film 180a may extend along the side walls and bottom surface of the lower active contact filling film 180b.

Contents of the material included in the lower active contact barrier film 180a may be the same as the description of the material included in the gate contact barrier film 160a. Contents of the material included in the lower active contact filling film 180b may be the same as the description of the material included in the gate contact filling film 160b.

An etching stop film 195 may extend along the upper surface 180_US of the lower active contact 180. The etching stop film 195 may not extend along the side walls of the gate structure GS. The etching stop film 195 may not extend to the upper surface 150_US of the gate capping pattern 150. The etching stop film 195 may not extend to the upper surface 190_US of the first interlayer insulating film 190. The etching stop film 195 may be selectively formed only on the conductive material. For example, the etching stop film 195 may be conformally formed along the upper surface 180_US of the lower active contact 180.

In FIG. 2, the etching stop film 195 does not overlap the gate capping pattern 150 in the first direction D1. The etching stop film 195 does not overlap the gate contact 160 in the first direction D1. The etching stop film 195 completely overlaps the gate electrode 120 in the first direction D1.

The etching stop film 195 may not overlap part of the upper active contact 185 in the first direction D1 and the second directions D2. Since the upper active contact 185 is formed to penetrate part of the etching stop film 195, the upper active contact 185 may include a portion which overlaps the etching stop film 195 in the first direction D1 and the second direction D2.

The etching stop film 195 may include a lower surface facing the lower active contact 180, and an upper surface opposite to the lower surface. The lower surface of the etching stop film 195 may contact the upper surface 180_US of the lower active contact 180. The upper surface of the etching stop film 195 may be lower than the upper surface 185_US of the upper active contact 185—assuming the upper surface of the substrate 100 as a reference. The upper surface of the etching stop film 195 may be lower than the upper surface 190_US of the first interlayer insulating film 190—assuming the upper surface of the substrate 100 as a reference. The upper surface of the etching stop film 195 may be lower than the upper surface 150_US of the gate capping pattern 150—assuming the upper surface of the substrate 100 as a reference.

In some embodiments, although the etching stop film 195 may be a single film. Although the etching stop film 195 may include, for example, silicon nitride (SiN), silicon oxynitride (SiON), silicon carbonitride (SiCN), silicon oxycarbonitride (SiOCN), aluminum oxide (AlO) aluminum nitride (AlN), metal oxides and combinations thereof, the technical idea of the inventive concept is not limited thereto.

The upper active contact 185 may be formed on the lower active contact 180 to penetrate the etching stop film 195. The upper active contact 185 may be disposed on the source/drain pattern 170. The upper active contact 185 may be disposed inside the first interlayer insulating film 190. The upper active contact 185 may be surrounded by the first interlayer insulating film 190.

A bottom surface 185_BS of the upper active contact 185 may contact the upper surface 180_US of the lower active contact 180. At the boundary between the upper active contact 185 and the lower active contact 180, the "length" (e.g., measured in the first direction D1) of the upper active contact 185 and the length of the lower active contact 180 may be different. At the boundary between the upper active contact 185 and the lower active contact 180, the width of the upper active contact 185 and the width of the lower active contact 180 may be different. That is, the length of the bottom surface 185_BS of the upper active contact 185 may be different from the length of the upper surface 180_US of the lower active contact 180.

The upper surface 185_US of the upper active contact 185 may be disposed at the same plane as the upper surface 190_US of the first interlayer insulating film 190. The upper surface 185_US of the upper active contact 185 may be disposed at the same plane as the upper surface 150_US of the gate capping pattern 150. The upper surface 185_US of the upper active contact 185 may be disposed at the same plane as the upper surface 160_US of the gate contact 160. That is, the upper surface 185_US of the upper active contact 185, the upper surface 190_US of the first interlayer insulating film 190, the upper surface 160_US of the gate contact 160, and the upper surface 150_US of the gate capping pattern 150 may be located at the same plane.

The bottom surface 185_BS of the upper active contact 185 may be lower than the upper surface 150_US of the gate capping pattern 150—assuming the upper surface of the substrate 100 as a reference. The bottom surface 185_BS of the upper active contact 185 may be lower than the upper surface 160_US of the gate contact 160—assuming the upper surface of the substrate 100 as a reference. The bottom surface 185_BS of the upper active contact 185 may be lower than the upper surface 190_US of the first interlayer insulating film 190—assuming the upper surface of the substrate 100 as a reference.

The upper active contact 185 may include an upper active contact barrier film 185a and an upper active contact filling film 185b. The upper active contact filling film 185b may be disposed on the upper active contact barrier film 185a. The upper active contact barrier film 185a may be disposed along the bottom surface and side walls of the upper active contact filling film 185b.

Materials included in the upper active contact barrier film 185a and the upper active contact filling film 185b may be the same those described in relation to the gate contact barrier film 160a and the gate contact filling film 160b.

In some embodiments, a second interlayer insulating film 290 and a third interlayer insulating film 390 may be formed on the first interlayer insulating film 190.

Each of the second interlayer insulating film 290 and the third interlayer insulating film 390 may include at least one of silicon oxide, silicon nitride, silicon oxynitride and a low-dielectric material.

In some embodiments, a wiring etching stop film 196 may extend along the upper surface 150_US of the gate capping pattern 150, and the upper surface 190_US of the first interlayer insulating film 190. The second interlayer insulating film 290 may be disposed on the wiring etching stop film 196. The wiring etching stop film 196 may include at least one material having an etching selectivity with respect to the second interlayer insulating film 290. The wiring etching stop film 196 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN) and aluminum oxycarbide (AlOC).

A first wiring pattern 210 may be disposed on the gate contact 160 and the upper active contact 185. The first wiring pattern 210 may be connected to the gate contact 160. The first wiring pattern 210 may be connected to the upper active contact 185. The first wiring pattern 210 may be formed to penetrate the wiring etching stop film 196.

The first wiring pattern 210 may be disposed within the second interlayer insulating film 290. The first wiring pattern 210 may include a portion directly contacting the gate capping pattern 150. The first wiring pattern 210 may have a multi conductive film structure. The first wiring pattern 210 may include, for example, a first wiring barrier film 210a and a first wiring filling film 210b. The first wiring filling film 210b may be disposed on the first wiring barrier film 210a. The first wiring barrier film 210a may be disposed along the side walls and bottom surface of the first wiring filling film 210b.

The first wiring barrier film 210a may include at least one of tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material.

The first wiring filling film 210b may include at least one of aluminum (Al), copper (Cu), tungsten (W), cobalt (Co), ruthenium (Ru), silver (Ag), gold (Au), manganese (Mn), and molybdenum (Mo).

In some embodiments, a via structure 310 and a second wiring pattern 320 may be included on the first wiring pattern 210. The via structure 310 and the second wiring pattern 320 may be disposed inside the third interlayer insulating film 390.

The via structure 310 may be formed on the first wiring pattern 210. The via structure 310 may be connected to the first wiring pattern 210. The via structure 310 may be a multi-film including a via liner film 310a and a via filling film 310b. The via filling film 310b may be disposed on the via liner film 310a. The via liner film 310a may be disposed along the side walls and bottom surface of the via filling film 310b.

The via liner film 310a may include at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), as well as two-dimensional (2D) material(s).

The via filling film 310b may include at least one of aluminum (Al), copper (Cu), tungsten (W), cobalt (Co), ruthenium (Ru), silver (Ag), gold (Au), manganese (Mn), and molybdenum (Mo).

The second wiring pattern 320 may be disposed on the via structure 310. The second wiring pattern 320 may be a multi-film including a second wiring liner film 320a and a second wiring filling film 320b.

The second wiring filling film 320b may be disposed on the second wiring liner film 320a. The second wiring liner film 320a may be disposed along the side walls and bottom surface of the second wiring filling film 320b. The materials included in the second wiring liner film 320a and the second wiring filling film 320b may be the same as those described in relation to the first wiring liner film 210a and the first wiring filling film 210b.

Each of FIGS. 4, 5, 6, 7, 8 and 9 is a cross-sectional diagram illustrating a semiconductor device according to embodiments of the inventive concept. For the sake of brevity, only material difference(s) between the respective embodiments of FIGS. 4, 5, 6, 7, 8 and 9 with the previously described embodiments of FIGS. 1, 2, 3A and 3B will be emphasized.

Figure 4:
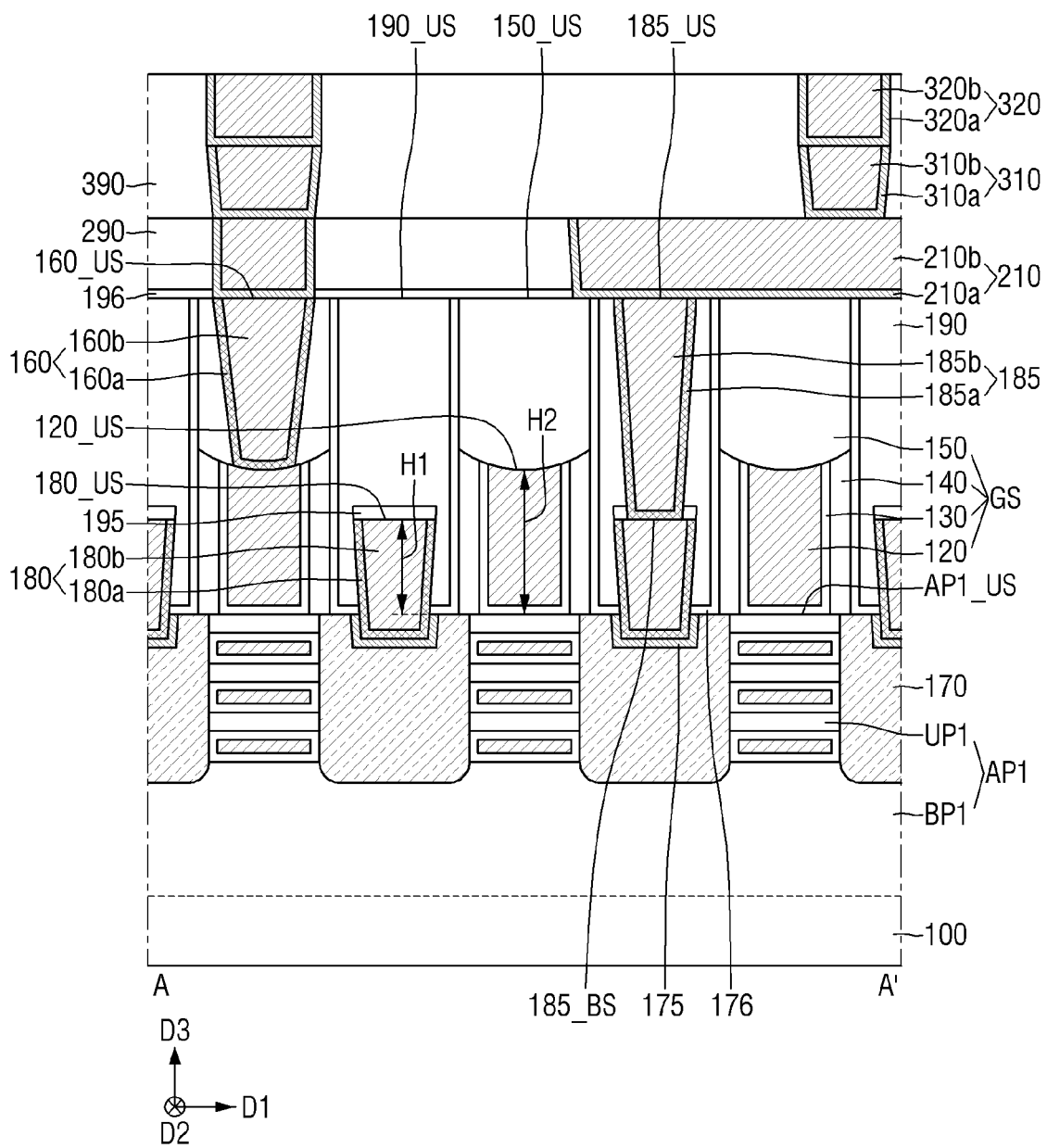
FIGS. 4, 5, 6, 7, 8 and 9 are respective cross-sectional diagrams illustrating semiconductor device(s) according to embodiments of the inventive concept.

Referring to FIG. 4, the gate spacer 140 may omit an inner spacer.

That is, the gate spacer 140 may be disposed on the gate insulating film 130 on the first active pattern AP1. However, the gate spacer 140 may not be disposed between the gate electrode 120 and the source/drain pattern 170, and may not be disposed between the adjacent sheet patterns UP1.

Figure 5:
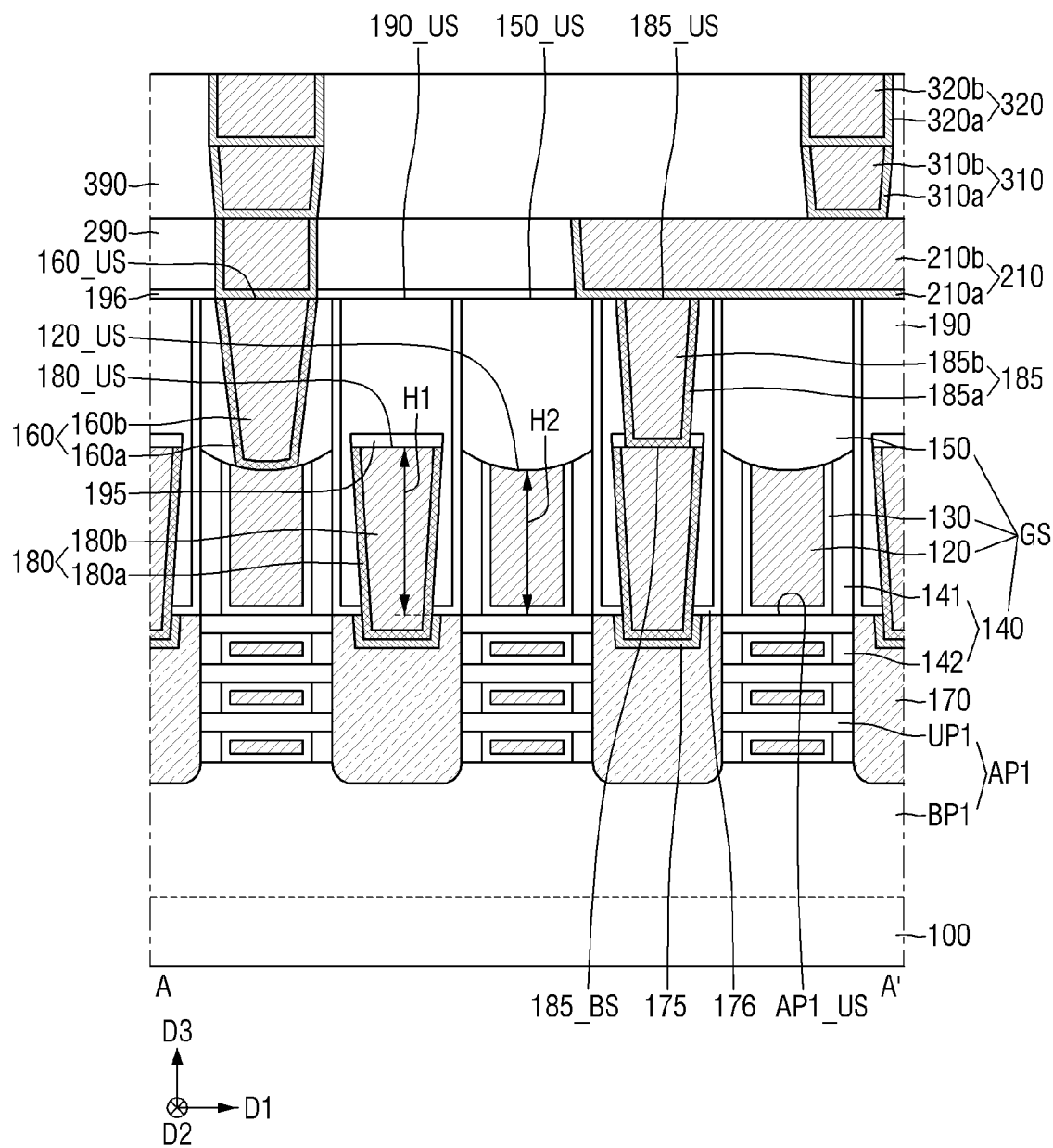

Referring to FIG. 5, the upper surface 180_US of the lower active contact 180 may be "higher than" the upper surface 120_US of the gate electrode 120—assuming the upper surface of the substrate 100 as a reference.

That is, a first height H1 from the upper surface AP1_US of the first active pattern AP1 to the upper surface 180_US of the lower active contact 180 may be greater than a second height H2 from the upper surface AP1_US of the first active pattern AP1 to the upper surface 120_US of the gate electrode 120.

In some embodiments, the etching stop film 195 may overlap the gate contact 160 in the first direction D1. The etching stop film 195 may overlap the gate capping pattern 150 in the first direction D1.

In some embodiments, the bottom surface 185_BS of the upper active contact 185 may be higher than the upper surface 120_US of the gate electrode 120—assuming the upper surface of the substrate 100 as a reference.

Figure 6:
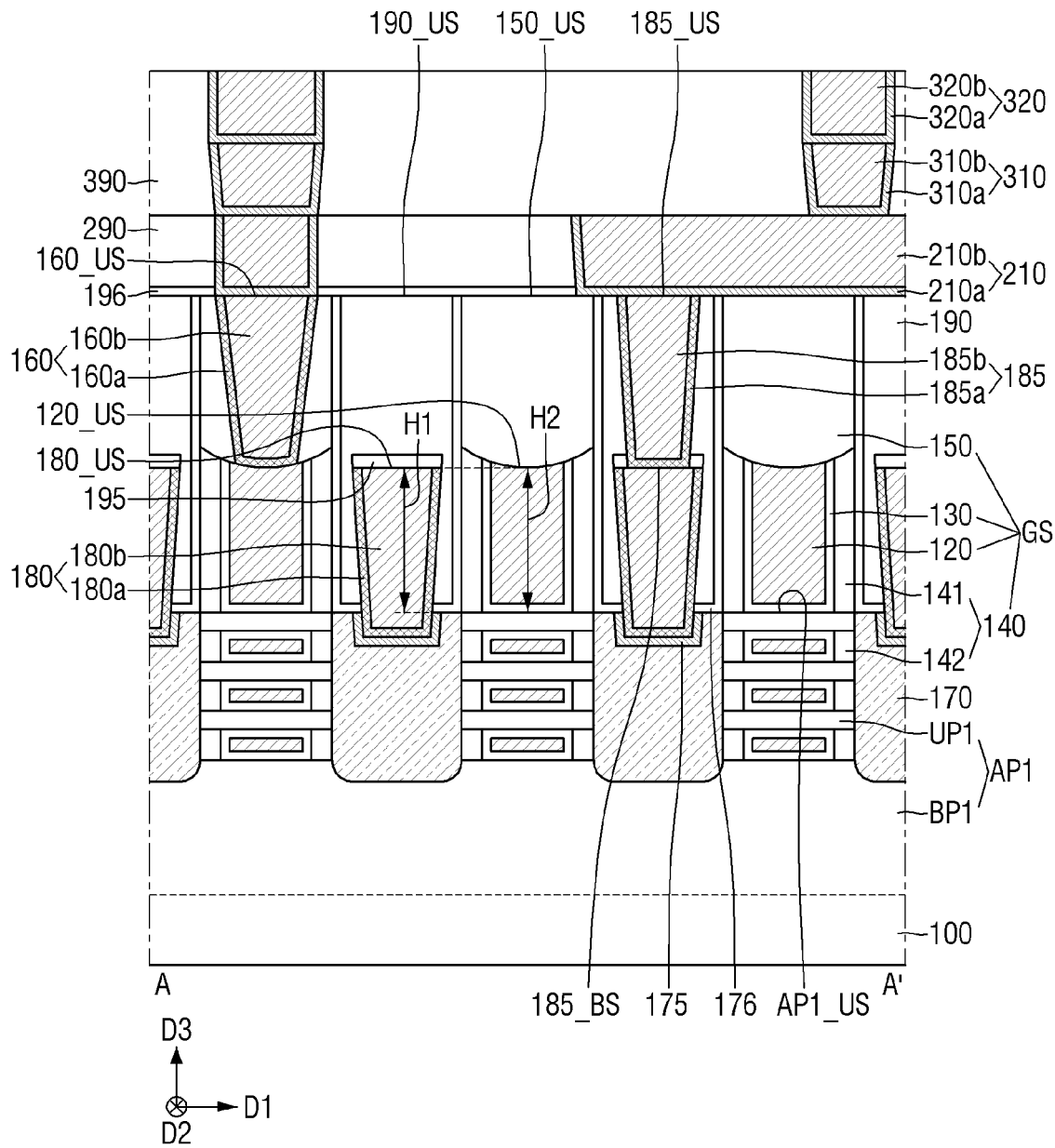

Referring to FIG. 6, the upper surface 180_US of the lower active contact 180 may be located at the same plane as the upper surface 120_US of the gate electrode 120.

That is, the first height H1 from the upper surface AP1_US of the first active pattern AP1 to the upper surface 180_US of the lower active contact 180 may be the same as the second height H2 from the upper surface AP1_US of the first active pattern AP1 to the upper surface 120_US of the gate electrode 120.

In some embodiments, the bottom surface 185_BS of the upper active contact 185 may be disposed at the same plane as the upper surface 120_US of the gate electrode 120.

Figure 7:
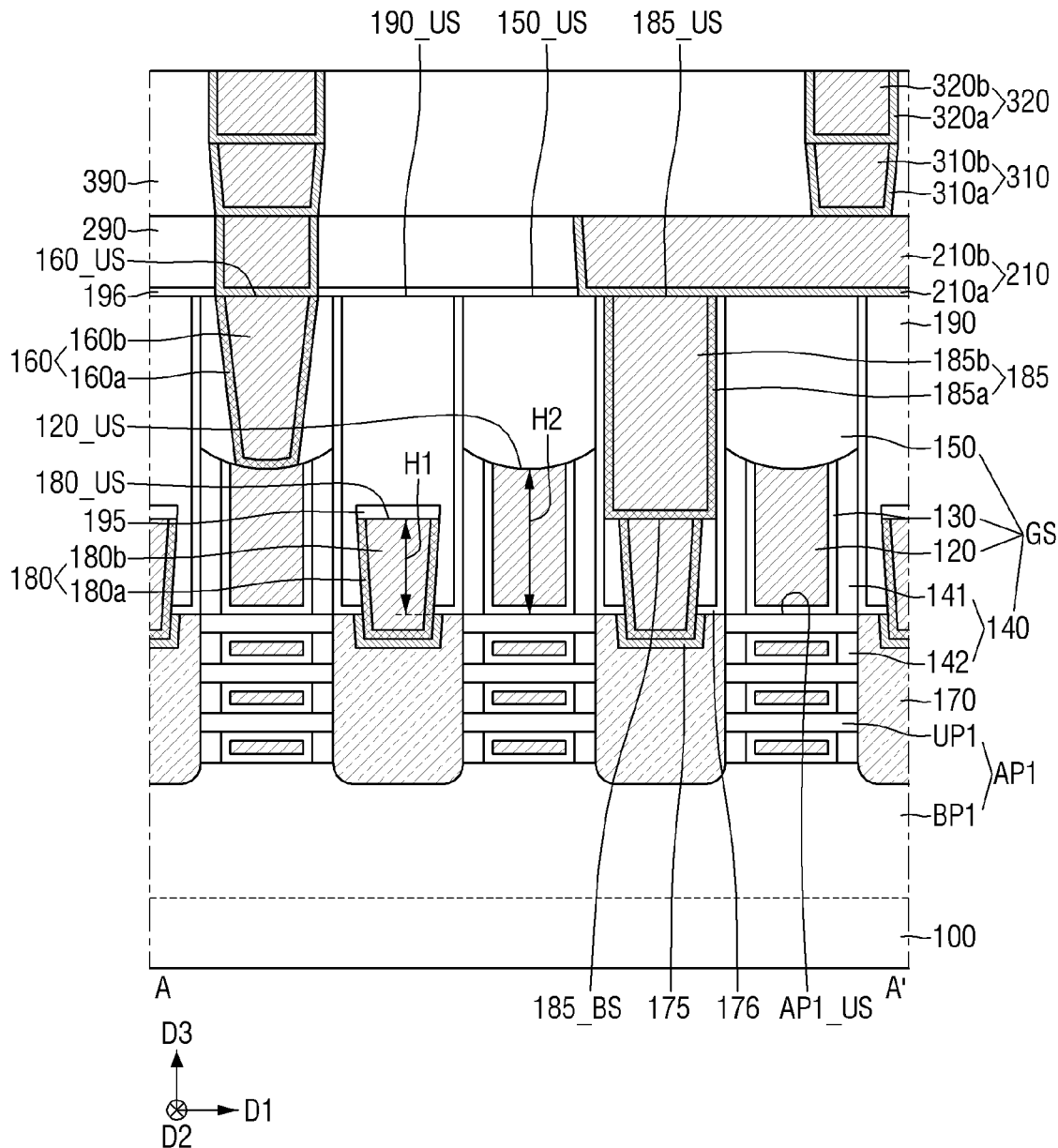

Referring to FIG. 7, the side wall of the upper active contact 185 may contact a protective film 176. Alternately, the side wall of the upper active contact 185 may contact part of the side wall of the gate structure GS. That is, the upper active contact 185 may not be completely surrounded by the first interlayer insulating film 190.

At a boundary between the upper active contact 185 and the lower active contact 180, the length of the upper active contact 185 may be greater than the length of the lower active contact 180.

Figure 8:
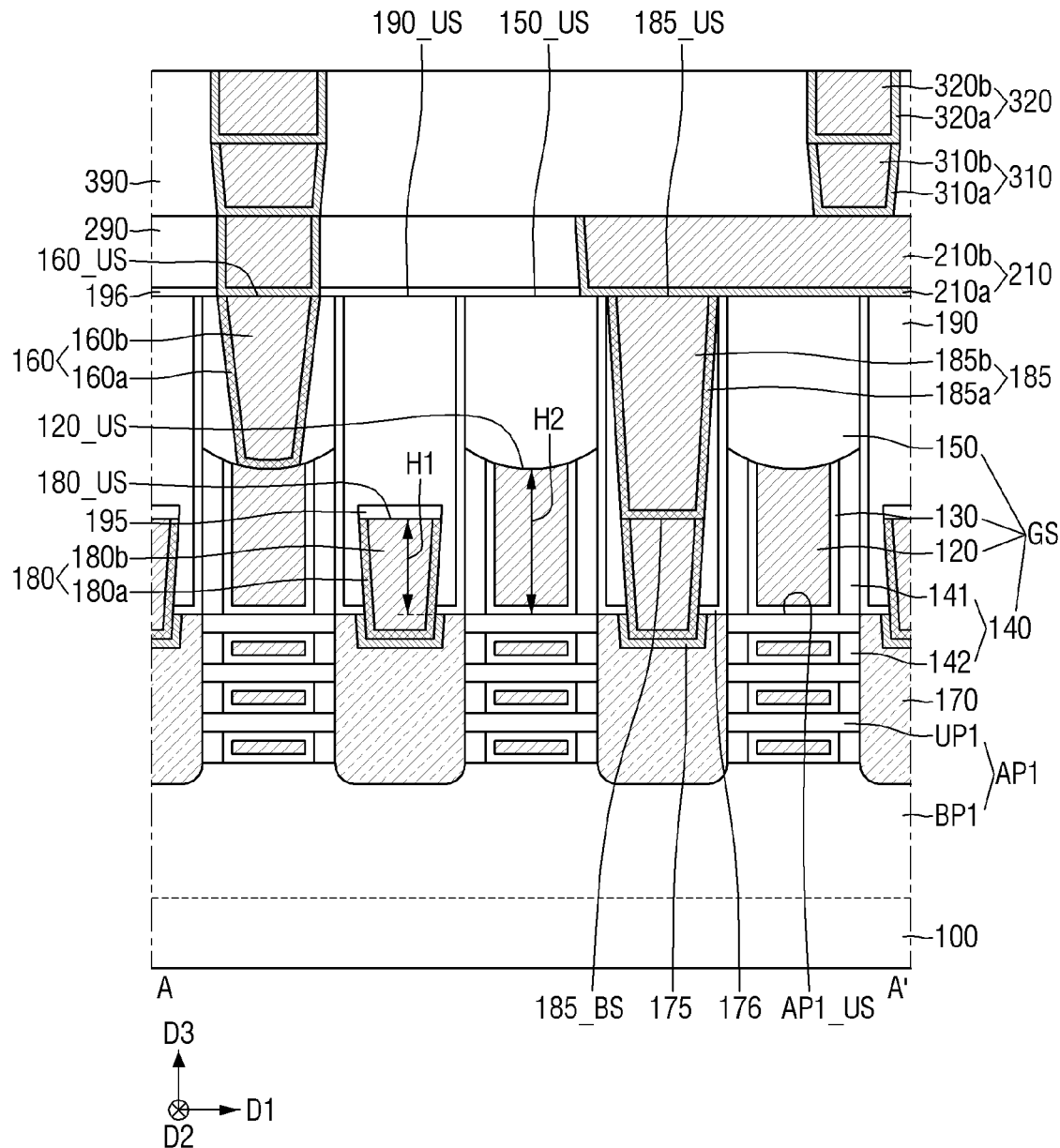

Referring to FIG. 8, at the boundary between the lower active contact 180 and the upper active contact 185, the length of the lower active contact 180 may be substantially the same as the length of the upper active contact 185.

Figure 9:
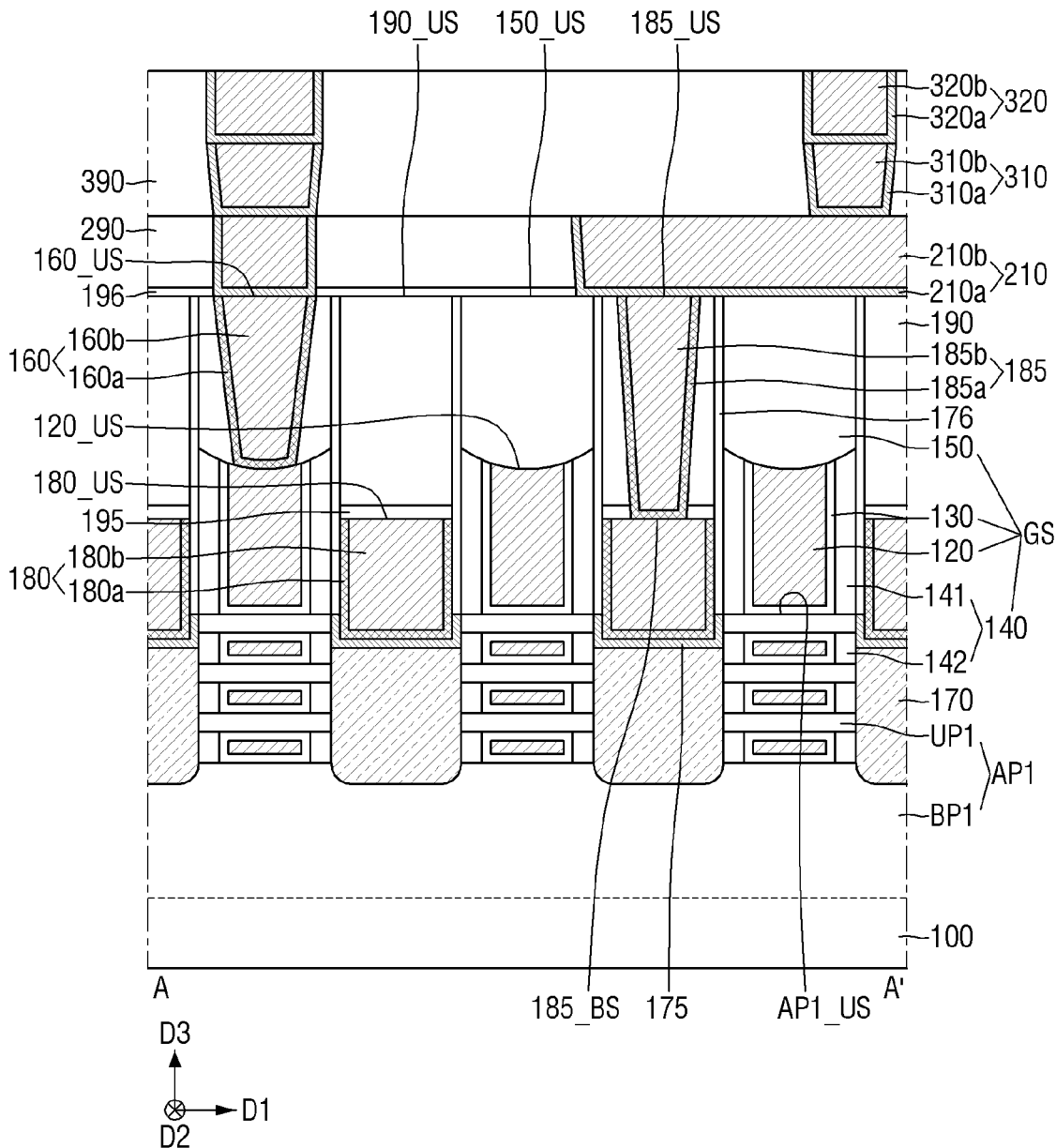

Referring to FIG. 9, the side wall of the lower active contact 180 may contact part of the side wall of the protective film 176.

That is, the lower active contact 180 may not be completely surrounded by the first interlayer insulating film 190. Although not shown, the side wall of the lower active contact 180 may contact part of the side wall of the gate structure GS. The side wall of the lower active contact 180 may contact part of the side wall of the gate spacer 140. The etching stop film 195 may not extend along the side walls of the gate structure GS.

Figure 10:
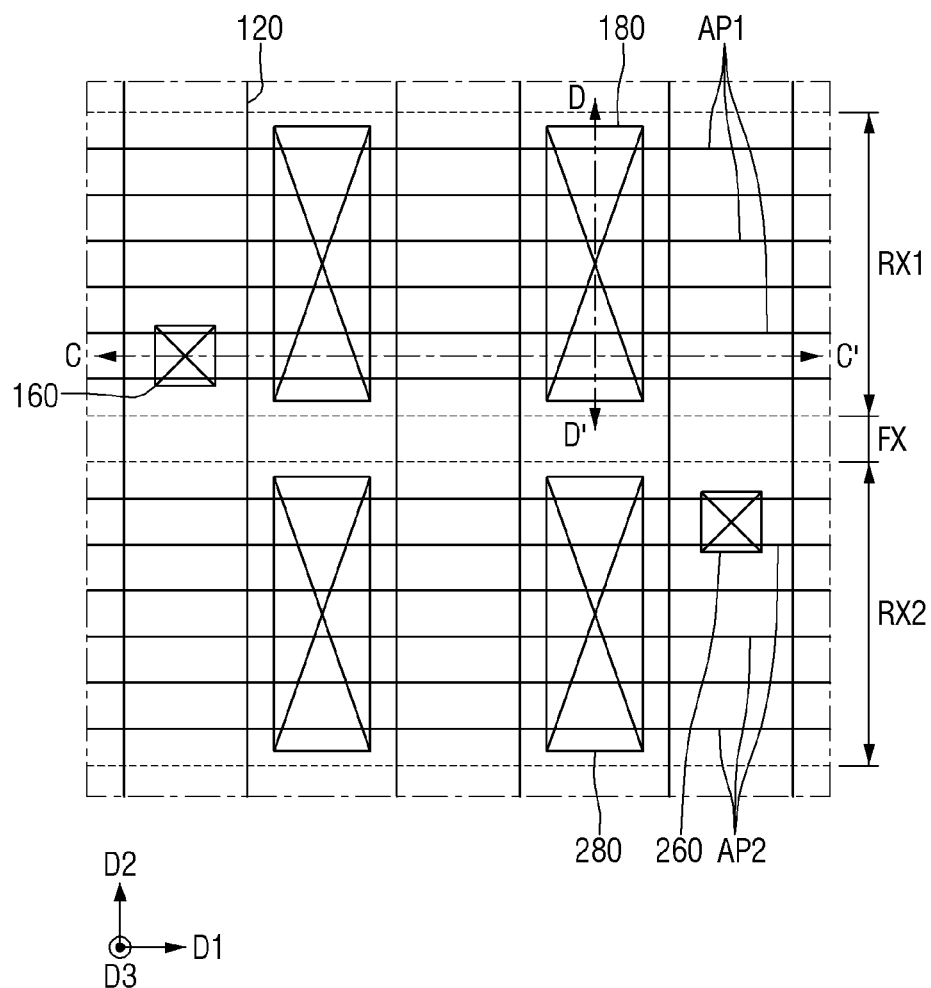
FIG. 10 is a plan diagram illustrating a semiconductor device according to embodiments of the inventive concept.
Figure 11:
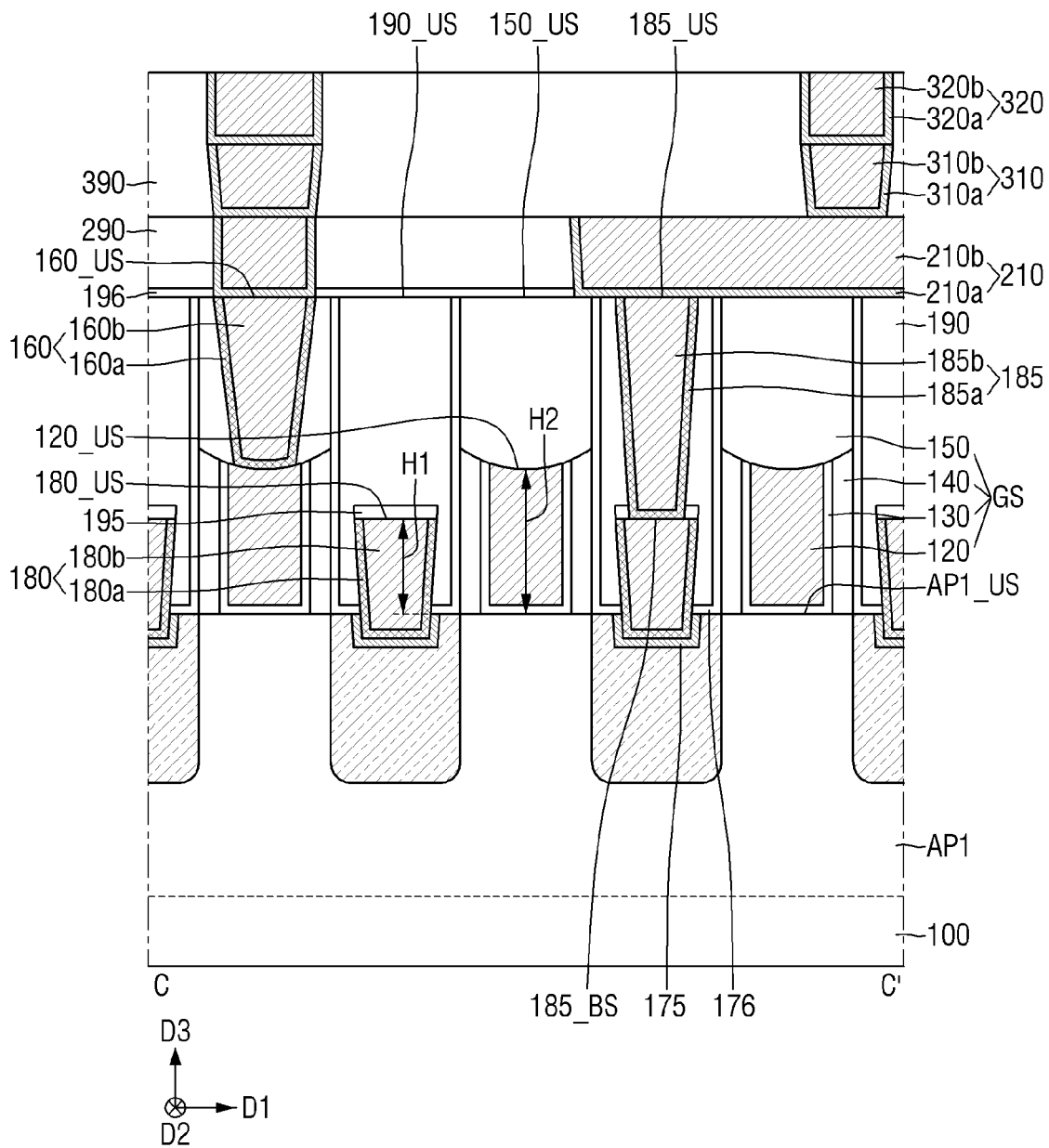
FIG. 11 is a cross-sectional view taken along C-C' of FIG. 10, and FIGS. 12A and 12B are cross-sectional diagrams taken along D-D' of FIG. 10.
Figure 12A:
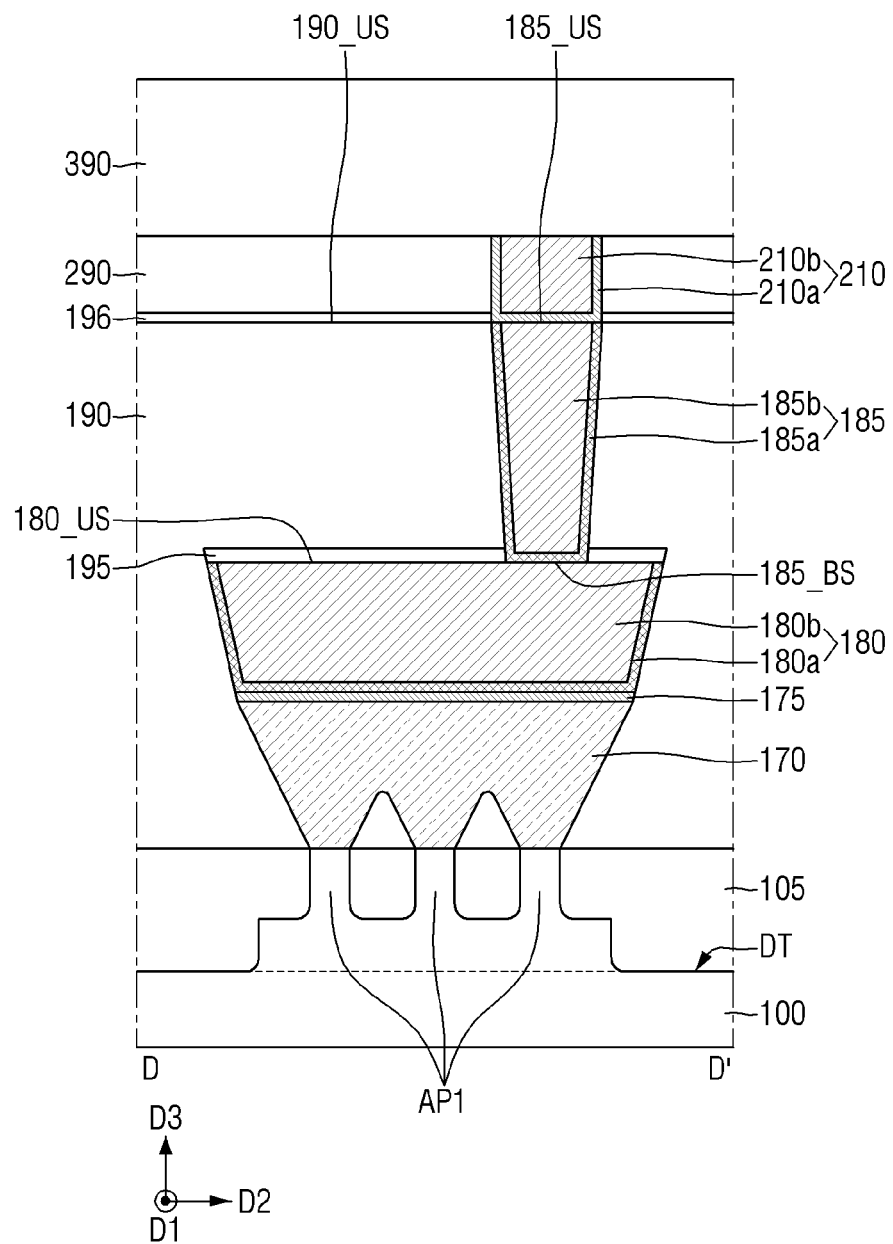
Figure 12B:
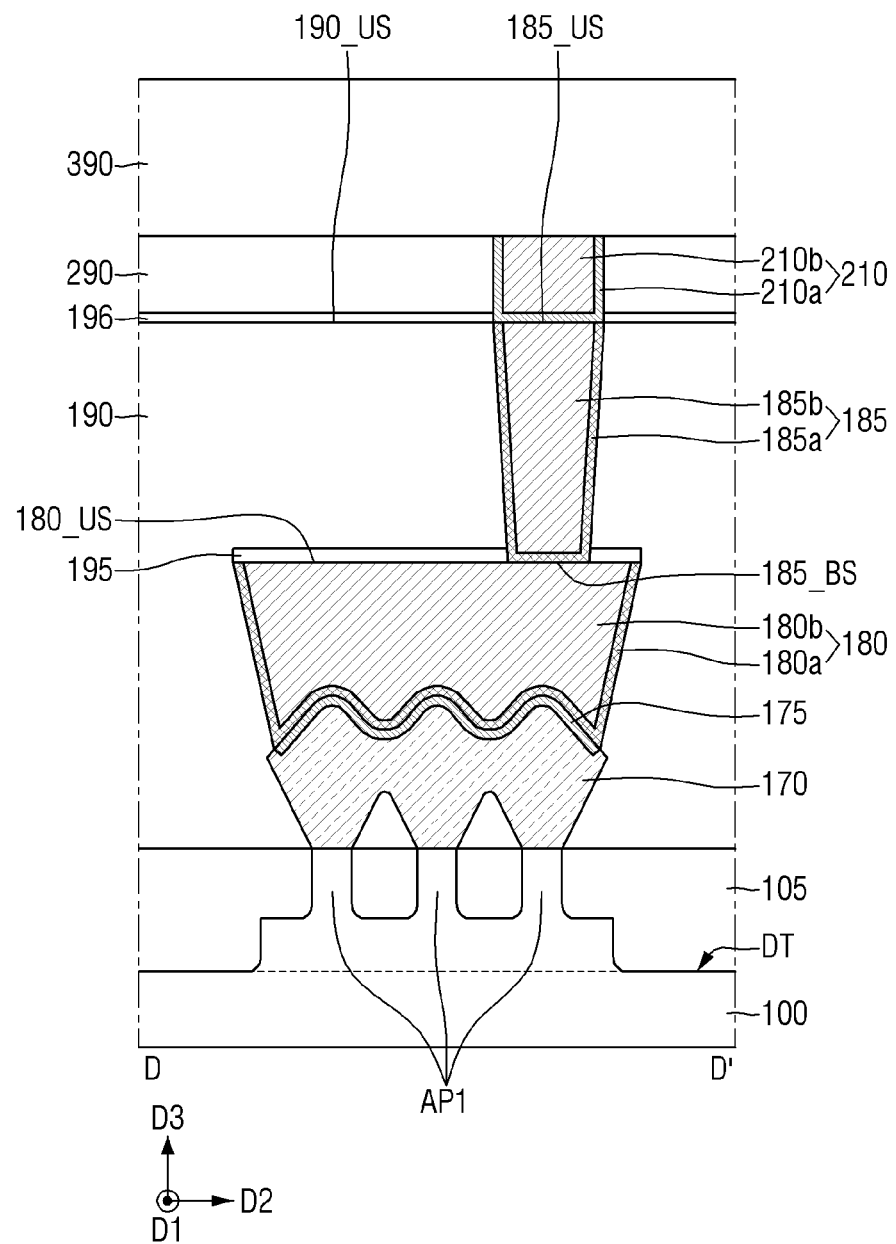

FIG. 10 is a plan diagram illustrating a semiconductor device according to embodiments of the inventive concept, FIG. 11 is a cross-sectional diagram taken along C-C' of FIG. 10, and FIGS. 12A and 12B are cross-sectional diagram taken along D-D' of FIG. 10. For the sake of brevity, only material difference(s) between the embodiment previously described in relation to FIGS. 1, 2, 3A, 3B, 4, 5, 6, 7 and 8 and the embodiments of FIGS. 10, 11, 12A and 12B will be described.

Referring to FIGS. 10, 11, 12A and 12B, the first active pattern AP1 of a semiconductor device according to embodiments of the inventive concept may include a fin-type pattern. Although not shown, the second active pattern AP2 may also include a fin-type pattern.

In FIG. 10, although each of the three first active patterns AP1 and the three second active patterns AP2 is shown, this is only for convenience of explanation, and the scope of the inventive concept is not limited thereto. One or more first active patterns AP1 and second active patterns AP2 may be provided, respectively.

Although the field region FX may be defined by a deep trench DT as shown in FIGS. 12A and 12B, the scope of the inventive concept is not limited thereto.

The field insulating film 105 may be formed on the substrate 100. The field insulating film 105 may be formed over the first active region RX1, the second active region RX2, and the field region FX. The field insulating film 105 may fill the deep trench DT.

Although the source/drain pattern 170 is shown as a merged form of three epitaxial patterns formed on each first active pattern AP1, this is only for convenience of explanation, and the scope of the inventive concept is not limited thereto. That is, the epitaxial patterns formed on each of the first active patterns AP1 may be separated.

In some embodiments, an air gap may be disposed in a space between the first source/drain patterns 150 merged with the field insulating films 105. In some embodiments, an insulating material may fill the space between the first source/drain patterns 150 merged with the field insulating film 105.

The upper surface of the source/drain pattern 170 may be substantially flat, as shown in FIG. 12A. Alternately, the upper surface of the source/drain pattern 170 may be non-flat (e.g., wavy or undulating), as shown in FIG. 12B.

FIGS. 13, 14, 15, 16, 17, 18, 19, 20, 21, 22, 23, 24, 25, 26, 27 and 28 (hereafter collectively, "FIGS. 13 to 28") are respective cross-sectional diagrams illustrating in one example a method of fabricating semiconductor device(s) according to embodiments of the inventive concept.

Figure 13:
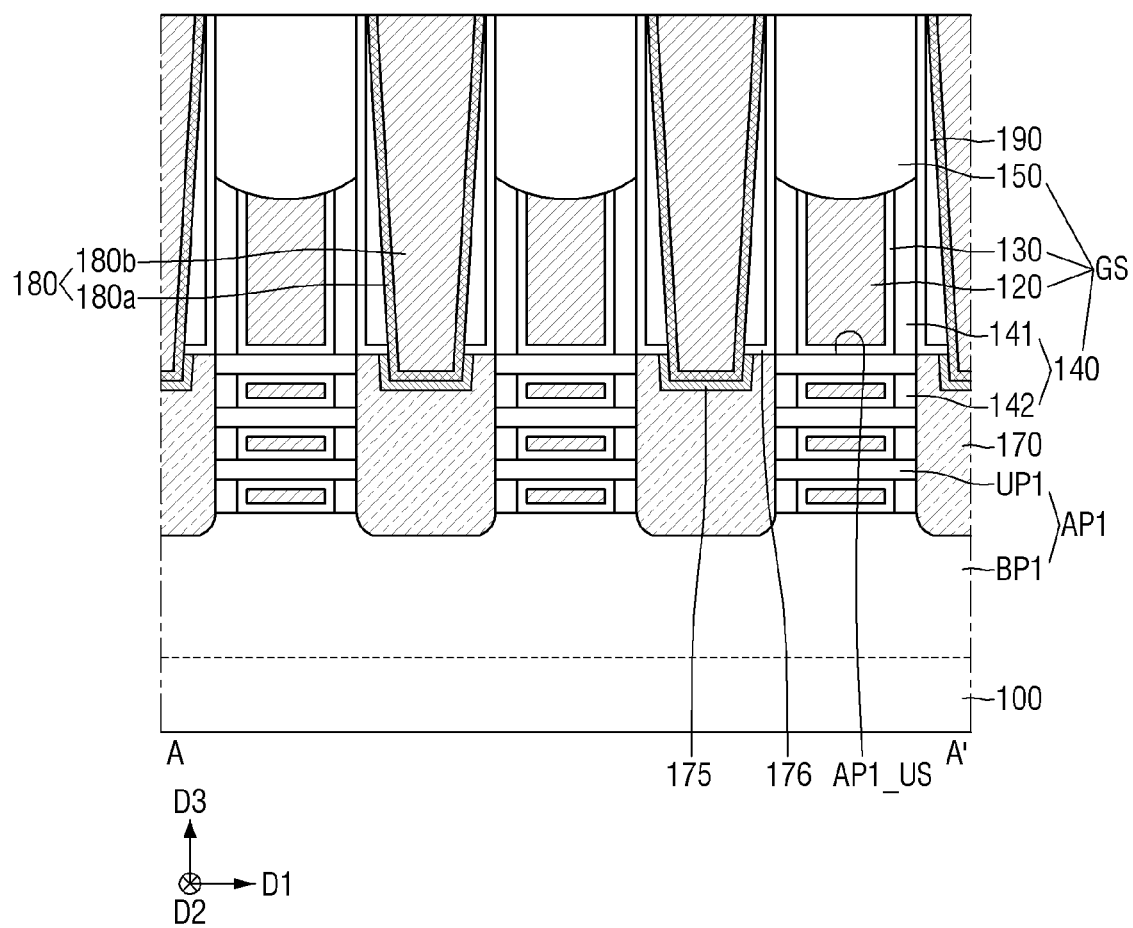
FIGS. 13, 14, 15, 16, 17, 18, 19, 20, 21, 22, 23, 24, 25, 26, 27 and 28 are respective and related cross-sectional diagrams illustrating in one example a method of fabricating semiconductor device(s) according to embodiments of the inventive concept.
Figure 14:
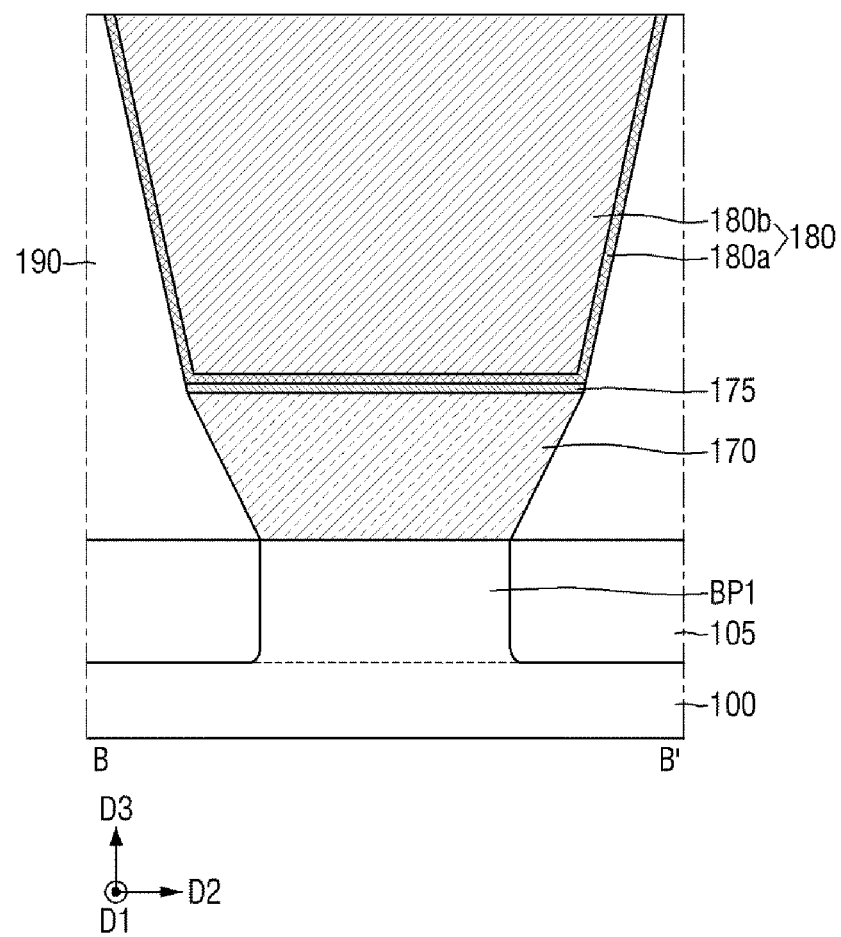

Referring to FIGS. 13 and 14, the gate structure GS may be formed on the first active pattern AP1.

The source/drain pattern 170 is formed on the first active pattern AP1 between the gate structures GS. The lower active contact 180 is formed penetrating the first interlayer insulating film 190 between the gate structures GS and contacting the source/drain pattern 170. In some embodiments, the side wall of the lower active contact 180 may be surrounded by the first interlayer insulating film 190.

Figure 15:
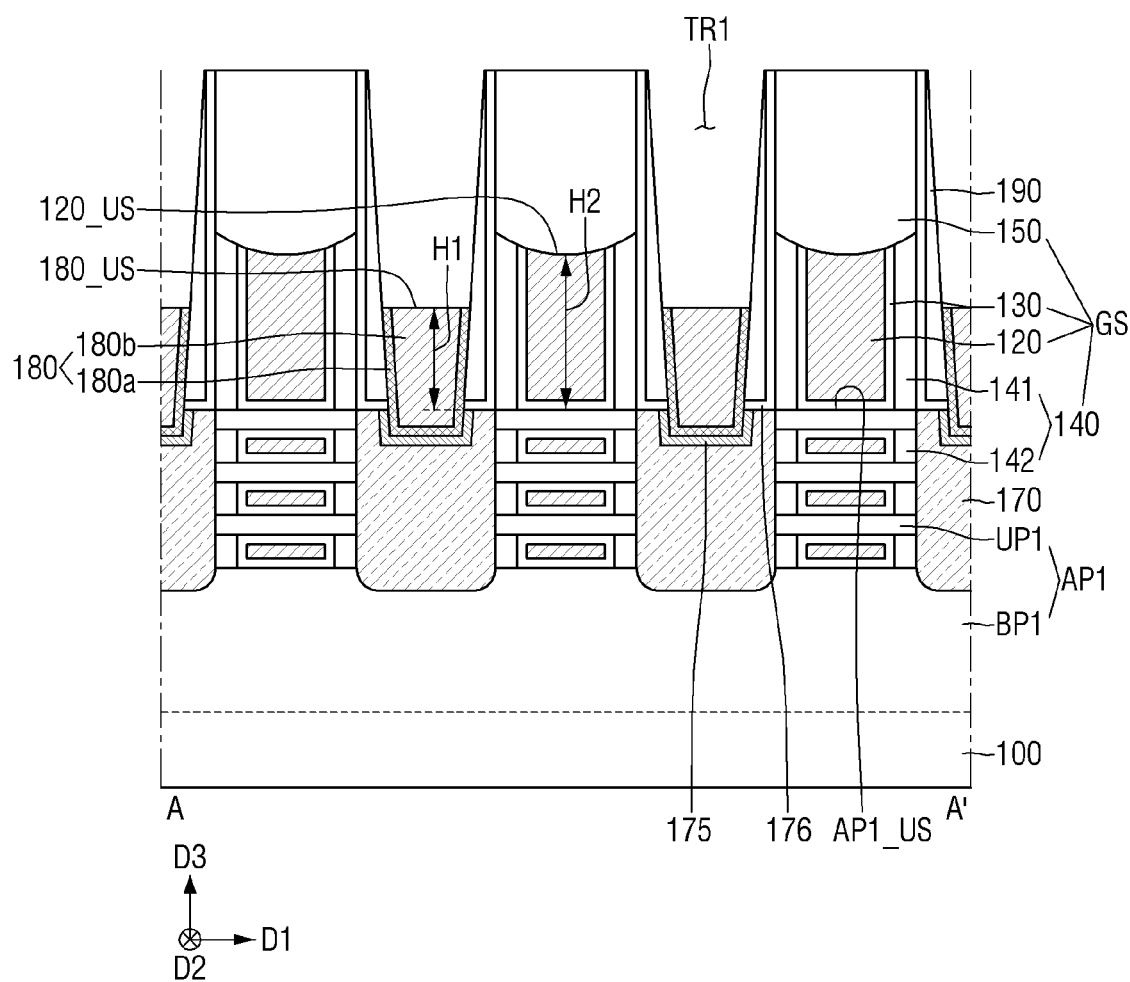
Figure 16:
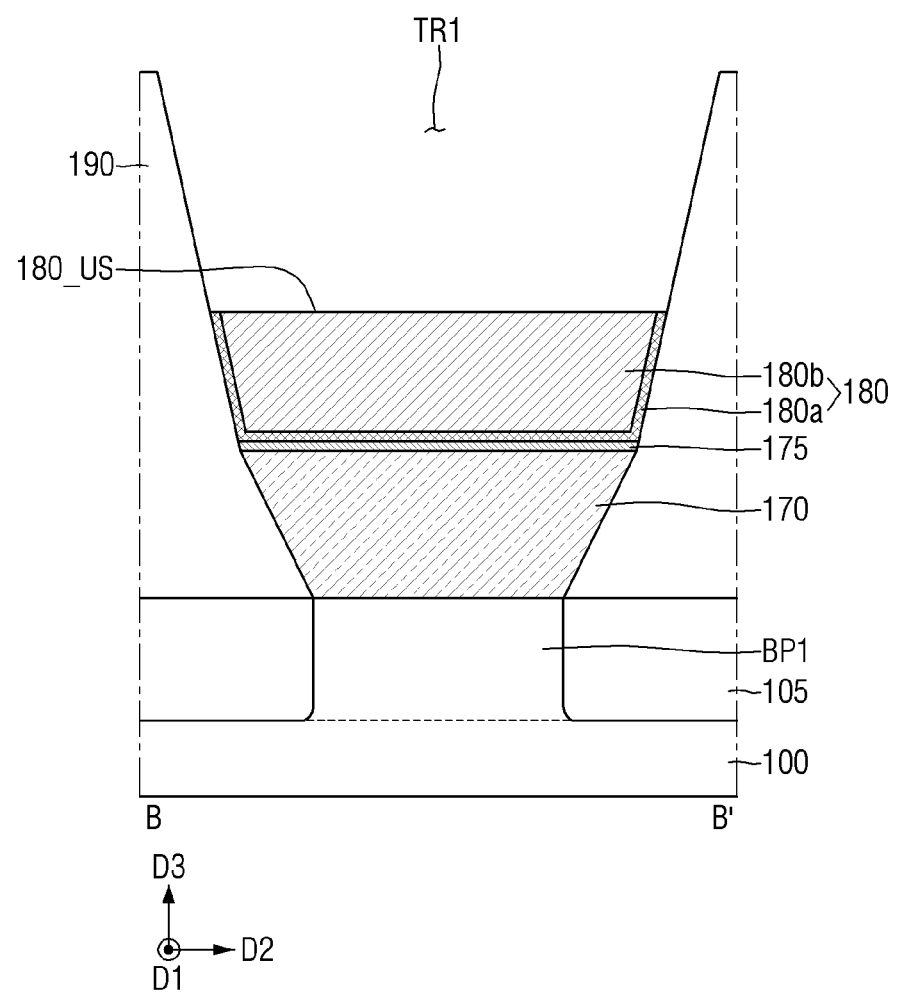

Referring to FIGS. 15 and 16, part of the lower active contact 180 may be removed to form a first trench TR1.

The upper surface 180_US of the lower active contact 180 is lower than the upper surface of the gate capping pattern 150—assuming the upper surface of the substrate 100 as a reference.

The upper surface 180_US of the lower active contact 180 is lower than the upper surface 120_US of the gate electrode 120—assuming the upper surface of the substrate 100 as a reference. That is, the first height H1 from the upper surface AP1_US of the first active pattern AP1 to the upper surface 180_US of the lower active contact 180 is lower than the second height H2 from the upper surface AP1_US of the first active pattern AP1 to the upper surface 120_US of the gate electrode s 120.

Figure 17:
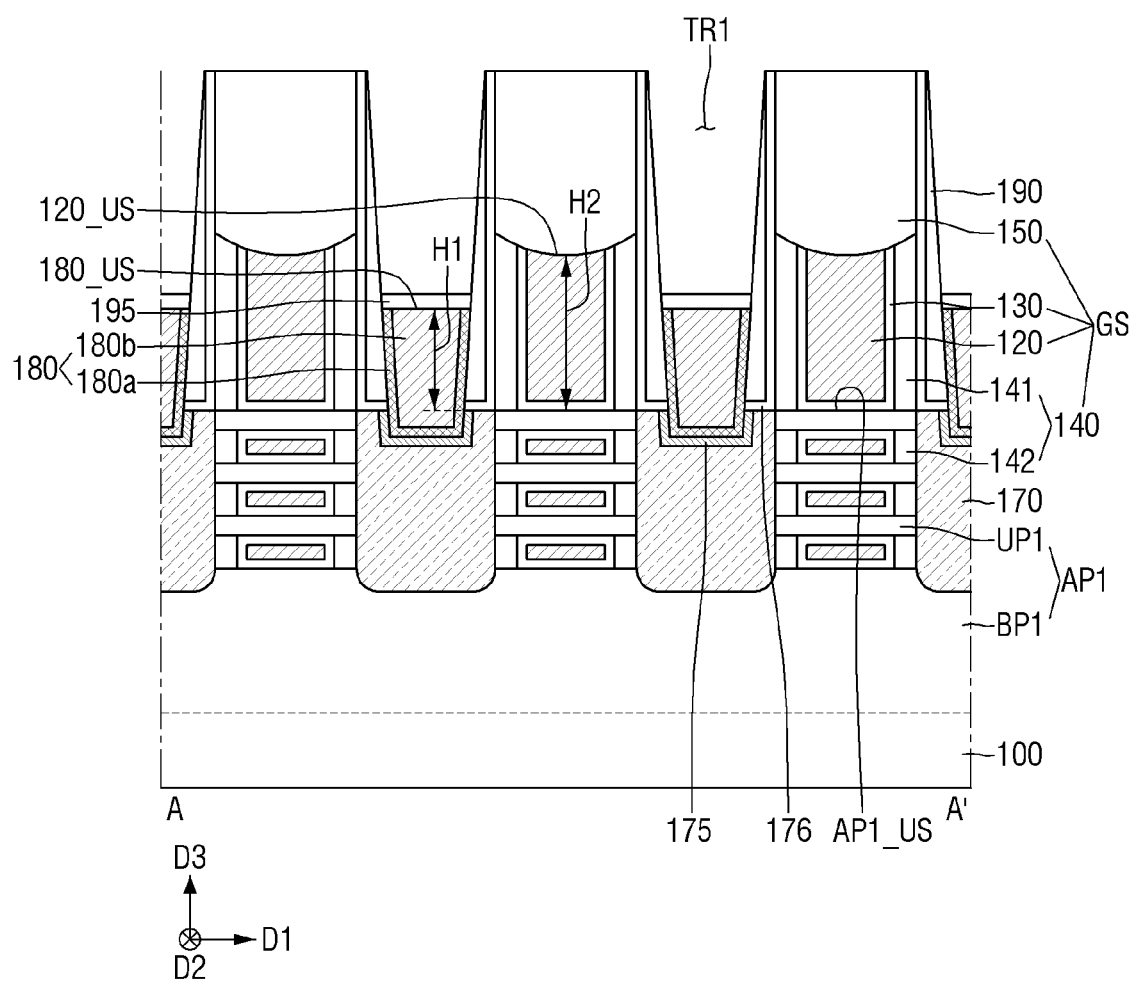
Figure 18:
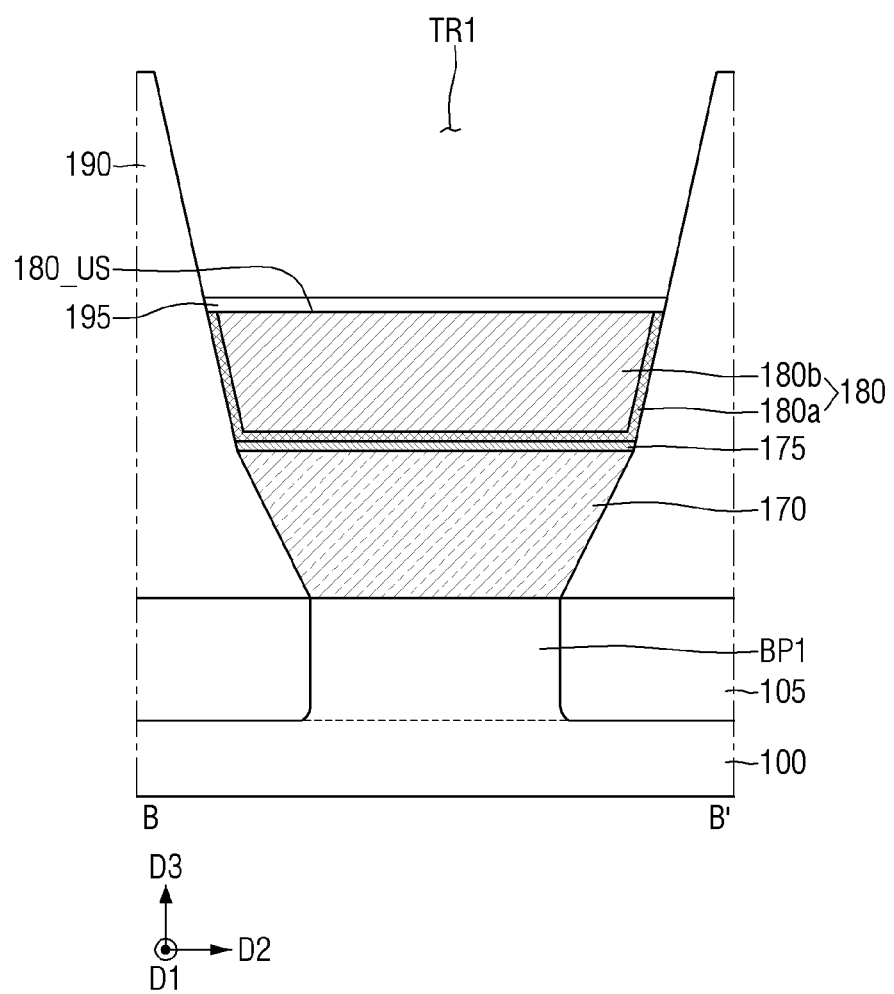

Referring to FIGS. 17 and 18, an etching stop film 195 may be formed extending along the upper surface 180_US of the lower active contact 180.

The etching stop film 195 may be formed on the bottom surface of the first trench TR1 (e.g., the etching stop film 195 may be selectively formed on the conductive material). That is, the etching stop film 195 may be conformally formed on the upper surface 180_US of the lower active contact 180. However, the etching stop film 195 does not extend along the side wall of the first trench TR1, and the etching stop film 195 is not be formed (e.g., deposited) on the insulating material.

Figure 19:
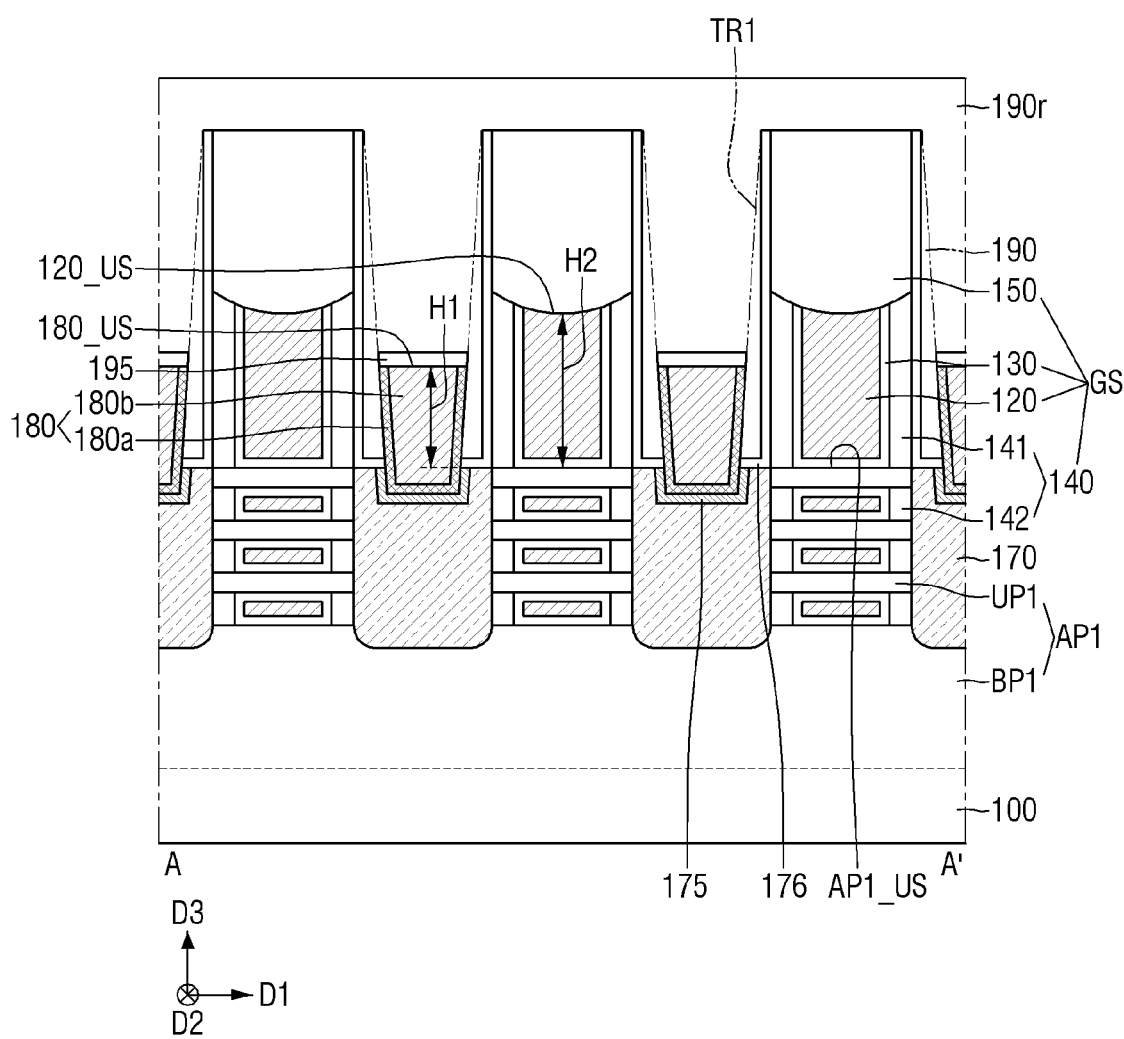
Figure 20:
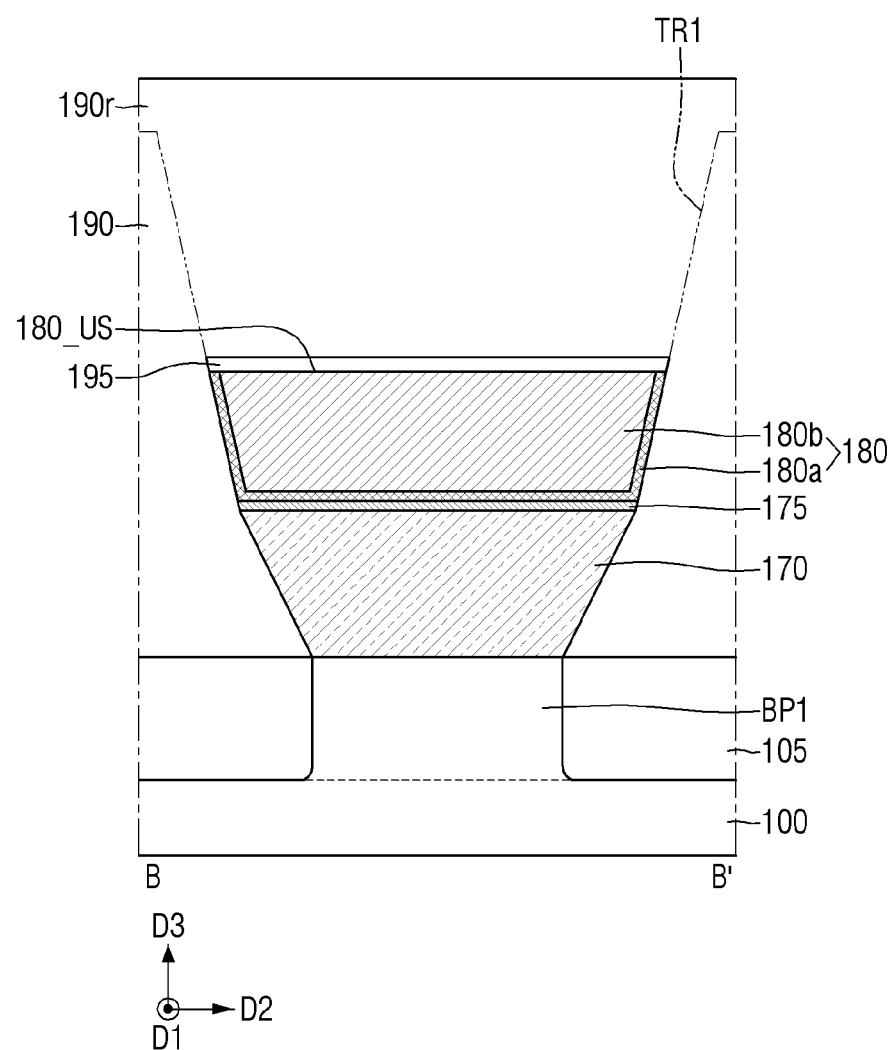

Referring to FIGS. 19 and 20, an interlayer insulating mold film 190r may be formed on the lower active contact 180.

In some embodiments, the interlayer insulating mold film 190r may fill the first trench TR1. The interlayer insulating film 190r may cover the upper surface 180_US of the lower active contact 180 and the upper surface of the gate capping pattern 150. The interlayer insulating mold film 190r may include, for example, the same material as the first interlayer insulating film 190. Thus, the first interlayer insulating film 190 and the interlayer insulating mold film 190r are separately identified herein only for clarity of explanation. The interlayer insulating mold film 190r may be included in the first interlayer insulating film 190. Hereinafter, the first interlayer insulating film 190 will be described as including the interlayer insulating mold film 190r.

Figure 21:
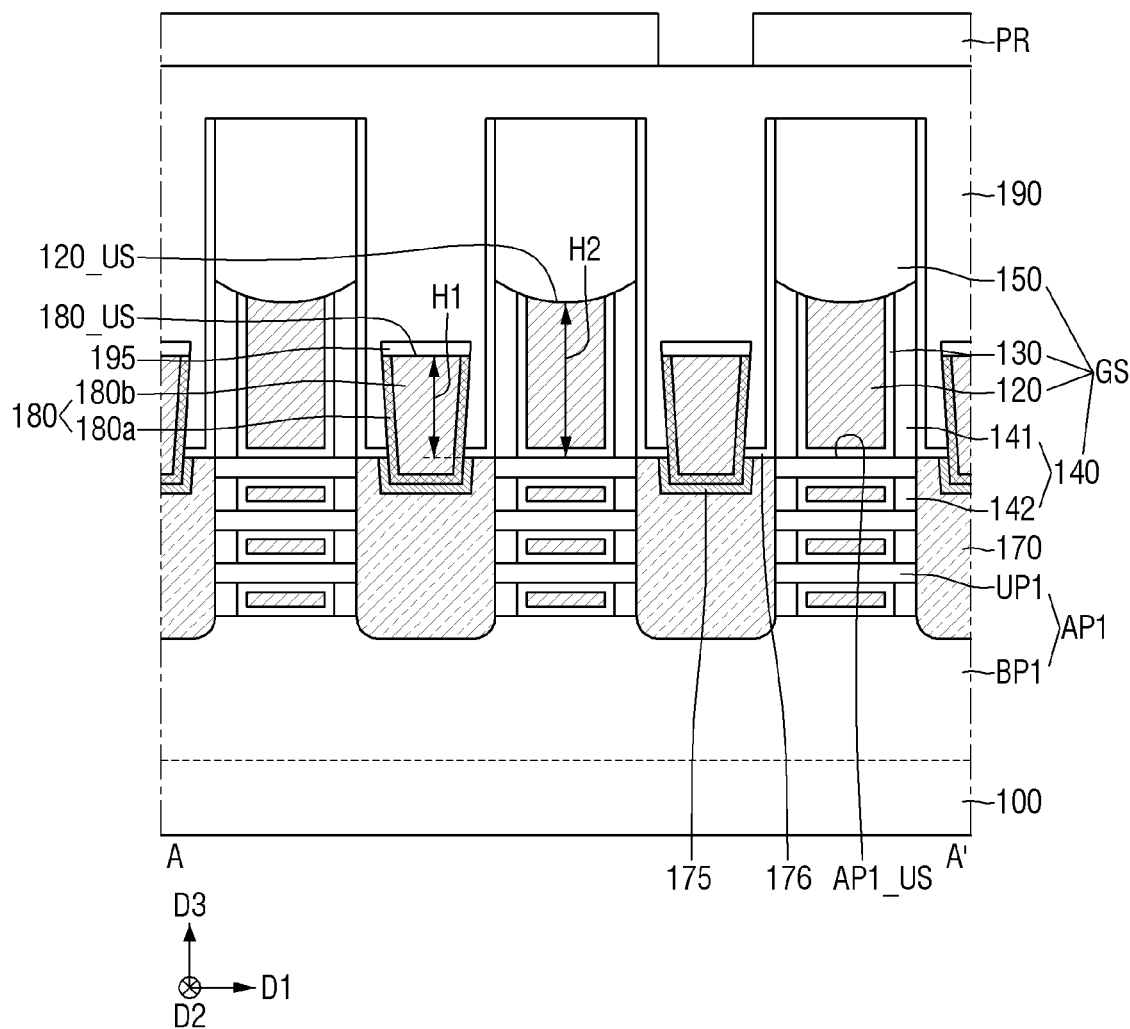
Figure 22:
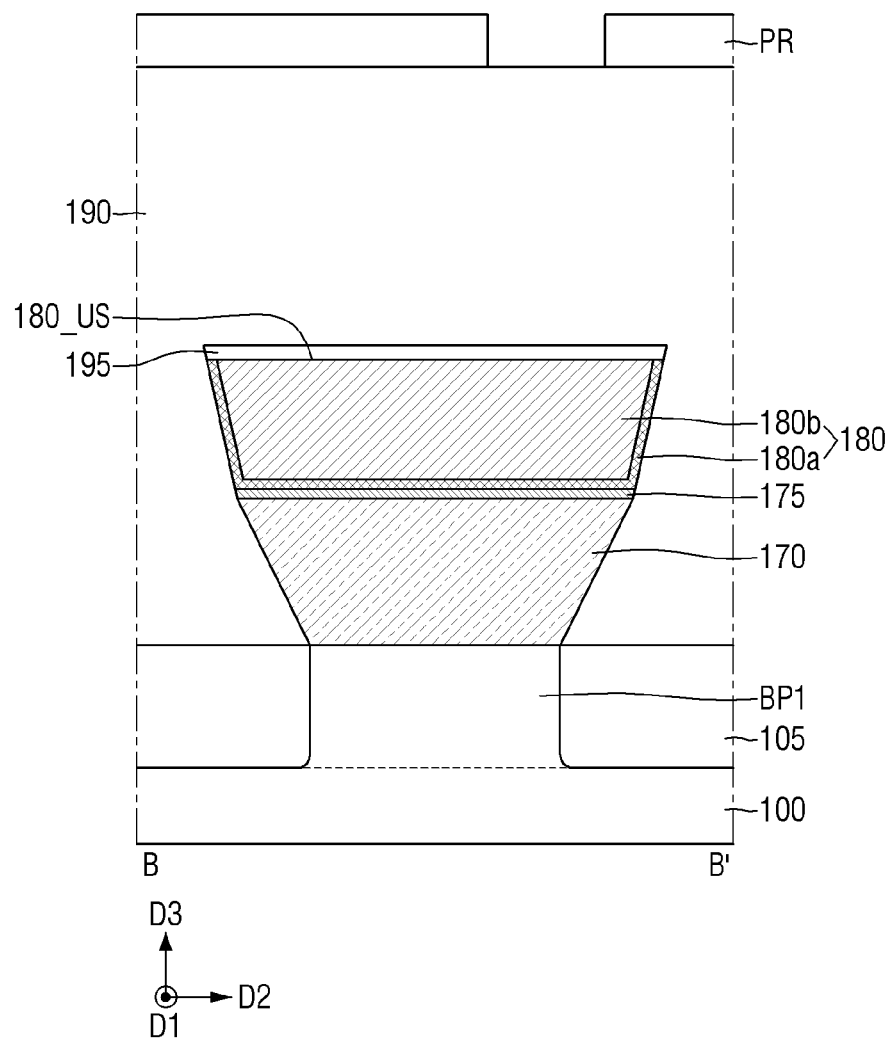

Referring to FIGS. 21 and 22, a photoresist PR may be formed on the first interlayer insulating film 190.

The photoresist PR may be used as a mask for forming an upper active contact 185 to be described below.

Figure 23:
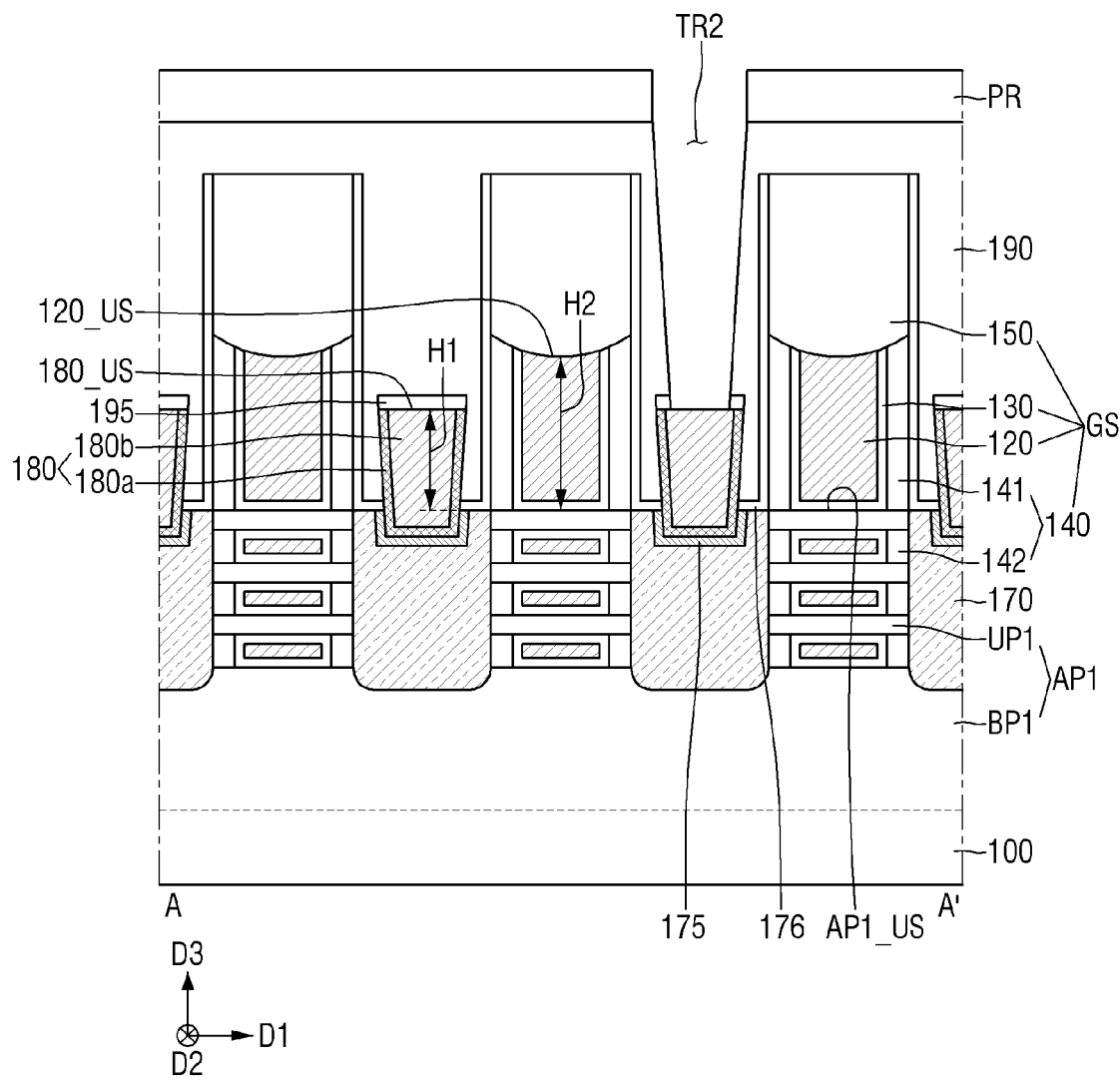
Figure 24:
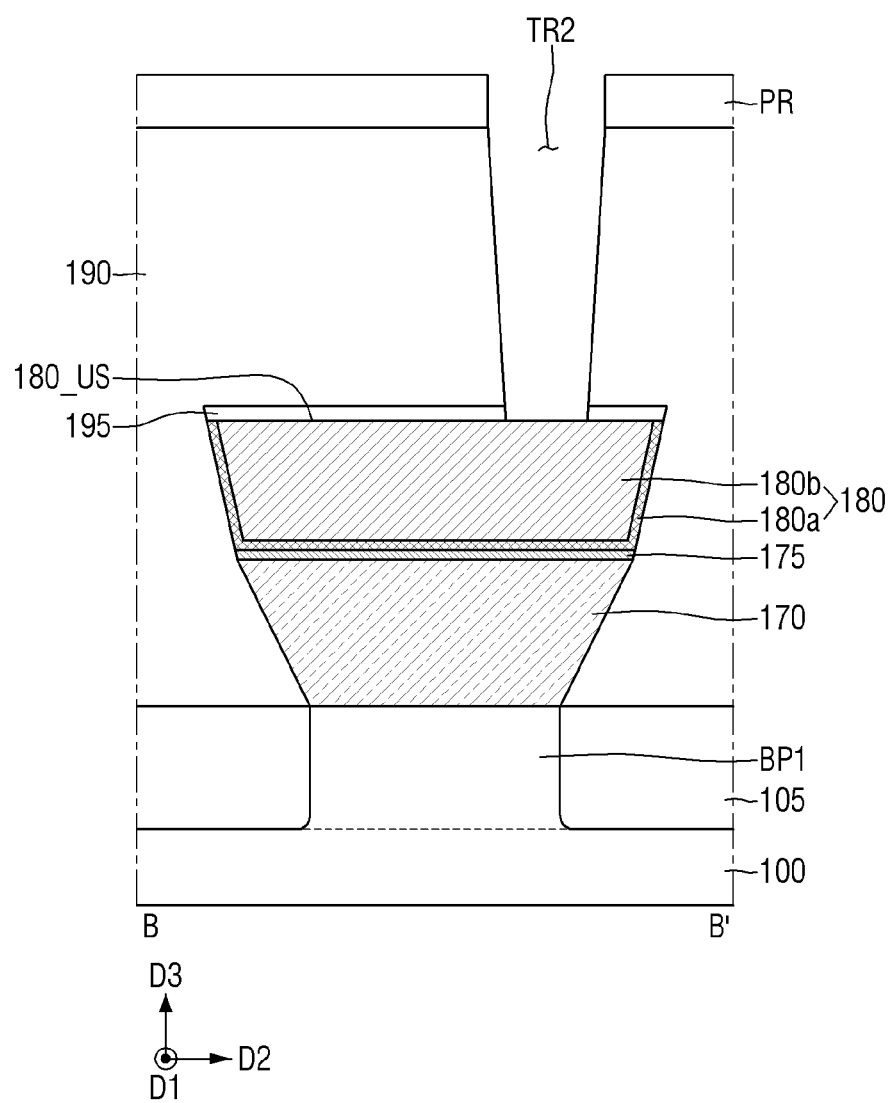

Referring to FIGS. 23 and 24, part of the first interlayer insulating film 190 may be removed to form a second trench TR2.

The second trench TR2 may penetrate downward (e.g., in the third direction D3) into the first interlayer insulating film 190 and the etching stop film 195 to selectively expose the upper surface 180_US of the lower active contact 180.

Figure 25:
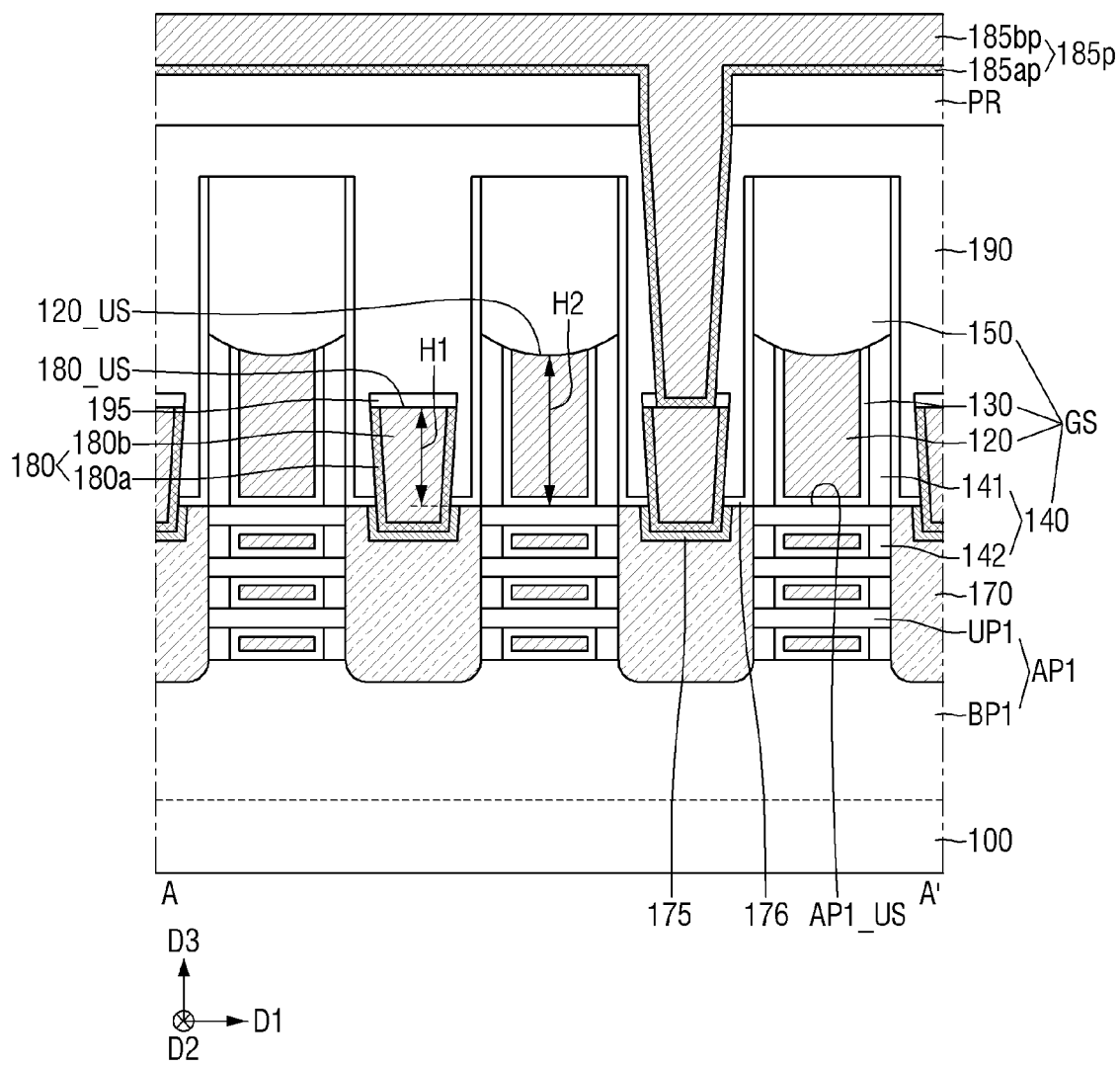
Figure 26:
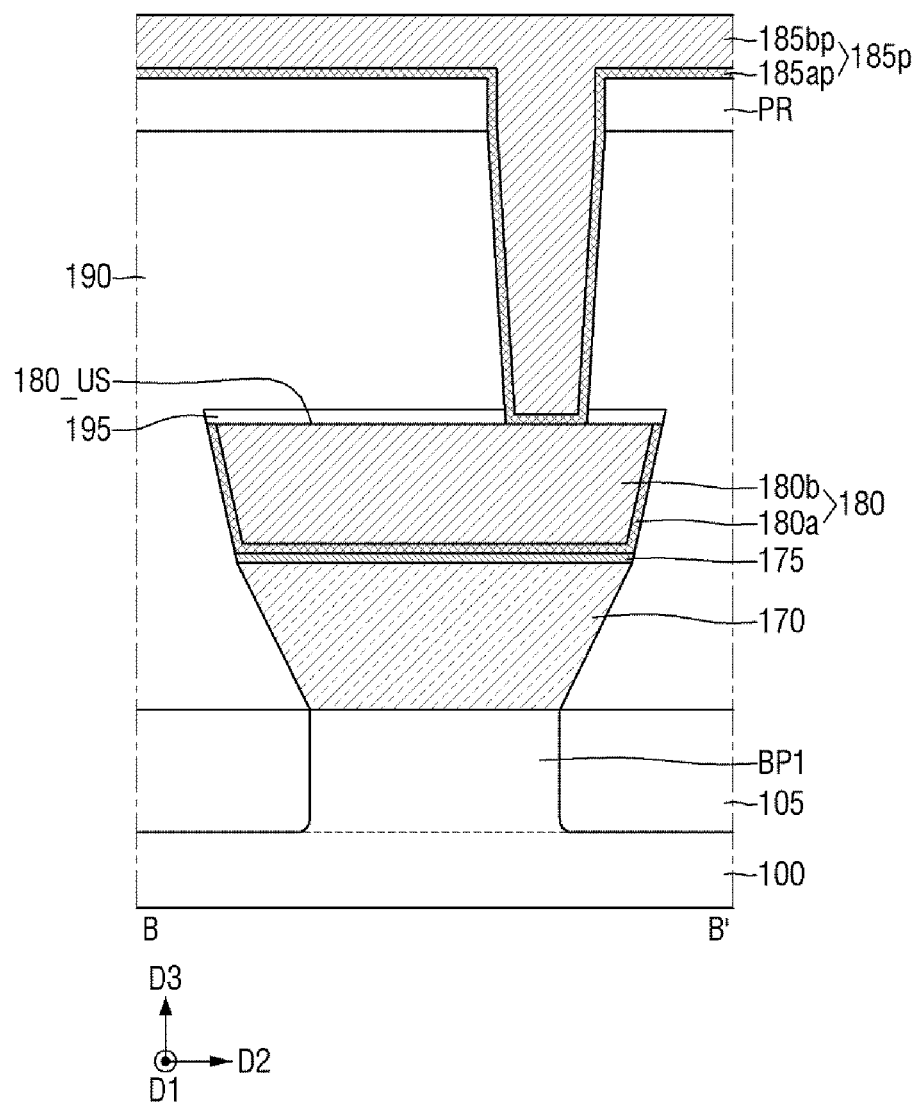

Referring to FIGS. 25 and 26, a pre upper active contact 185p may be formed that fills the second trench TR2 and covers the upper surface of the photoresist PR. That is, a pre upper active contact barrier film 185ap may be formed extending along the bottom surface of the second trench TR2, the side wall of the second trench TR2, and the upper surface of the photoresist PR, and then a pre upper active contact filling film 185bp may be formed on the pre upper active contact barrier film 185ap.

Figure 27:
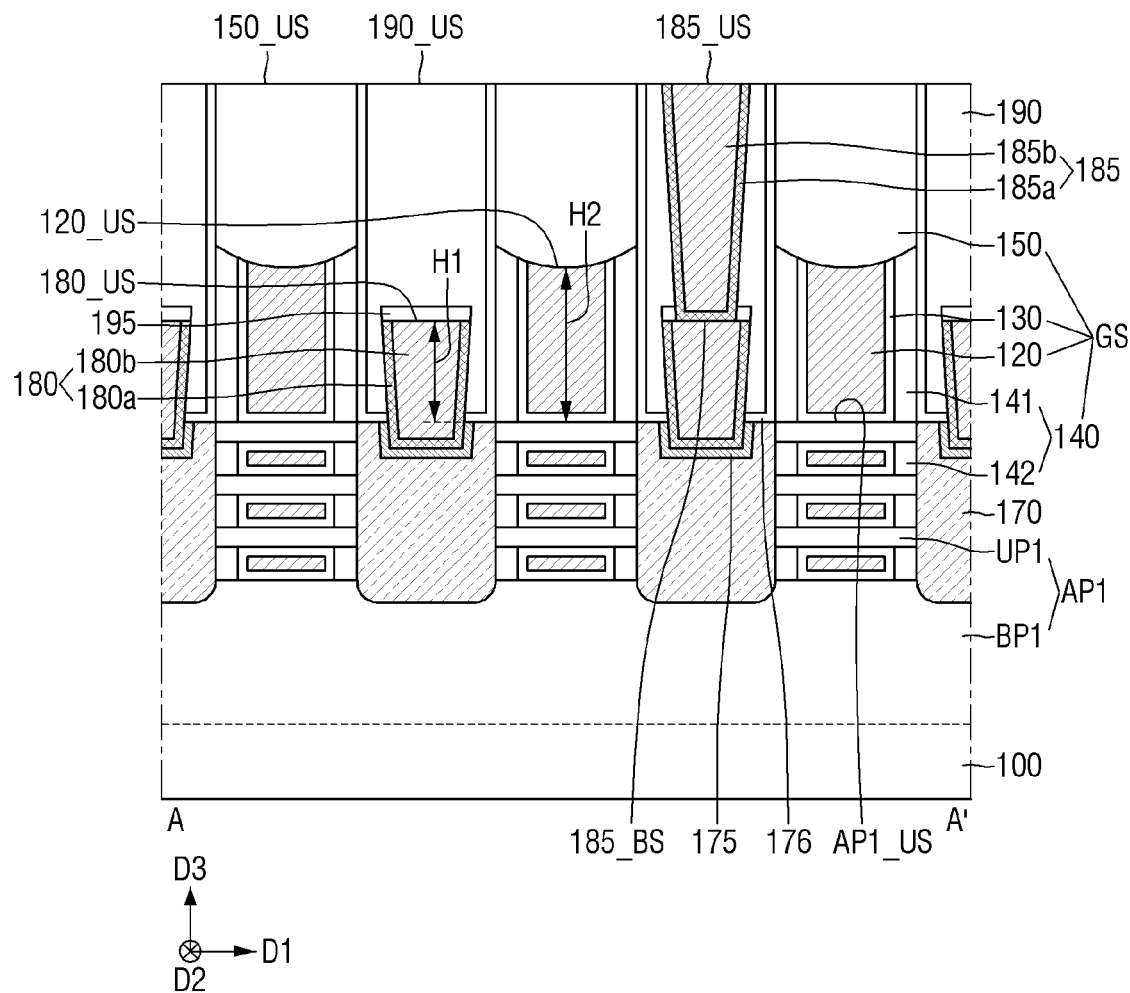
Figure 28:
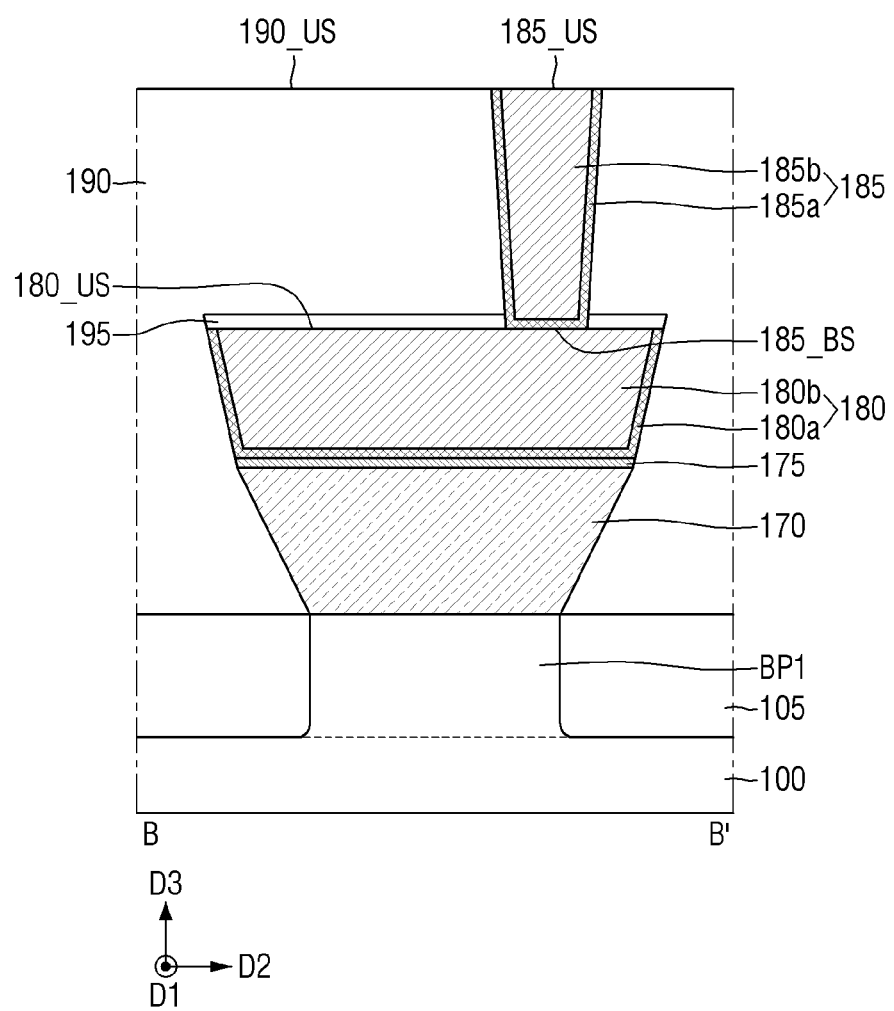

Referring to FIGS. 27 and 28, part of the pre upper active contact 185p may be removed to form an upper active contact 185.

The upper surface 185_US of the upper active contact 185 and the upper surface 150_US of the gate capping pattern 150 may be located at the same plane. The upper surface 185_US of the upper active contact 185 and the upper surface 190_US of the first interlayer insulating film 190 may be disposed at the same plane. That is, the upper surface 185_US of the upper active contact 185, the upper surface 150_US of the gate capping pattern 150, and the upper surface 190_US of the first interlayer insulating film 190 may be disposed at the same plane.

Those skilled in the art will appreciate that many variations and modifications may be made to the illustrated embodiments presented herein without substantially departing from the scope of inventive concept as defined by the following claims.

What is claimed is:

1. A semiconductor device comprising:
   an active pattern extending in a first direction on a substrate;
   gate structures extending in a second direction on the active pattern, wherein each gate structure includes a gate electrode intersecting the active pattern and a gate capping pattern on the gate electrode;
   a source/drain pattern disposed on the active pattern between adjacent gate structures;

a lower active contact connected to the source/drain pattern;

an etching stop film extending along an upper surface of the lower active contact without contacting an upper surface of the gate capping pattern; and an upper active contact connected to the lower active contact, wherein a bottom surface of the upper active contact is lower than the upper surface of the gate capping pattern.

2. The semiconductor device of claim 1, wherein the upper surface of the gate capping pattern is at a same plane as an upper surface of the upper active contact.

3. The semiconductor device of claim 1, wherein a first height from an upper surface of the active pattern to an upper surface of the lower active contact is less than a second height from the upper surface of the active pattern to an upper surface of the gate electrode.

4. The semiconductor device of claim 1, further comprising:
a gate contact connected to the gate electrode, wherein the gate contact overlaps the upper active contact in the first direction.

5. The semiconductor device of claim 4, wherein an upper surface of the gate contact is at a same plane as the upper surface of the upper active contact.

6. The semiconductor device of claim 1, further comprising:
a wiring pattern directly connected to the upper active contact.

7. The semiconductor device of claim 6, wherein the wiring pattern contacts the gate capping pattern.

8. The semiconductor device of claim 1, wherein the active pattern includes a sheet pattern.

9. The semiconductor device of claim 1, wherein the active pattern includes a fin-type pattern.

10. The semiconductor device of claim 1, wherein the etching stop film is a single film.

11. The semiconductor device of claim 10, wherein the etching stop film includes at least one of silicon nitride, silicon oxynitride, silicon carbonitride, silicon oxycarbonitride and aluminum oxide.

12. The semiconductor device of claim 1, wherein a length of the upper active contact in the first direction is different from a length of the lower active contact in the first direction at a boundary between the upper active contact and the lower active contact.

13. A semiconductor device comprising:
an active pattern extending in a first direction on a substrate;
gate structures disposed on the active pattern and extending in a second direction intersecting the first direction, wherein each gate structure includes a gate electrode intersecting the active pattern and a gate capping pattern on the gate electrode;
a source/drain pattern disposed on the active pattern between the gate structures;
an interlayer insulating film disposed on the source/drain pattern, wherein an upper surface of the interlayer insulating film is at a same plane as an upper surface of the gate capping pattern;
a lower active contact disposed in the interlayer insulating film and connecting the source/drain pattern, wherein an upper surface of the lower active contact is lower than the upper surface of the interlayer insulating film;
an etching stop film extending along the upper surface of the lower active contact; and
an upper active contact disposed within the interlayer insulating film and penetrating the etching stop film to contact the lower active contact,
wherein the etching stop film does not extend to the upper surface of the interlayer insulating film.

14. The semiconductor device of claim 13, further comprising:
a wiring etching stop film extending along the upper surface of the interlayer insulating film.

15. The semiconductor device of claim 13, wherein the etching stop film is a single film.

16. The semiconductor device of claim 15, wherein the etching stop film includes at least one of silicon nitride, silicon oxynitride, silicon carbonitride, silicon oxycarbonitride and aluminum oxide.

17. A semiconductor device comprising:
an active pattern extending in a first direction on a substrate;
gate structures disposed on the active pattern and extending in a second direction intersecting the first direction, wherein each of the gate structures includes a gate electrode intersecting the active pattern, and a gate capping pattern;
a source/drain pattern disposed on the active pattern between the gate structures;
an interlayer insulating film disposed on the source/drain pattern, wherein an upper surface of the interlayer insulating film is at a same plane as an upper surface of the gate capping pattern;
a lower active contact disposed within an interlayer insulating film and connected to the source/drain pattern, wherein an upper surface of the lower active contact is lower than an upper surface of the interlayer insulating film;
an etching stop film disposed within the interlayer insulating film and extending along the upper surface of the lower active contact;
an upper active contact disposed within the interlayer insulating film and penetrating the etching stop film to contact the lower active contact;
a wiring etching stop film extending along the upper surface of the gate capping pattern, the upper surface of the interlayer insulating film, and an upper surface of the upper active contact; and
a wiring pattern formed on the upper active contact to penetrate the wiring etching stop film,
wherein a bottom surface of the upper active contact is lower than the upper surface of the gate capping pattern,
the etching stop film does not extend to the upper surface of the interlayer insulating film, and
the etching stop film does not extend to the upper surface of the gate capping pattern.

18. The semiconductor device of claim 17, wherein the etching stop film is a single film.

19. The semiconductor device of claim 17, wherein the upper surface of the gate capping pattern is at a same plane as the upper surface of the upper active contact.

20. The semiconductor device of claim 17, wherein the wiring pattern contacts the gate capping pattern.

* * * * *